US010610864B2

(12) United States Patent
Paprotny et al.

(10) Patent No.: US 10,610,864 B2
(45) Date of Patent: Apr. 7, 2020

(54) SYSTEM AND METHODS OF CONCENTRATING AIRBORNE PARTICLES

(71) Applicant: The Board of Trustees of the University of Illinois, Urbana, IL (US)

(72) Inventors: Igor Paprotny, Chicago, IL (US); Omid Mahdavipour, Chicago, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 317 days.

(21) Appl. No.: 15/564,929

(22) PCT Filed: Apr. 8, 2016

(86) PCT No.: PCT/US2016/026657
§ 371 (c)(1),
(2) Date: Oct. 6, 2017

(87) PCT Pub. No.: WO2016/164733
PCT Pub. Date: Oct. 13, 2016

(65) Prior Publication Data

US 2018/0099283 A1 Apr. 12, 2018

Related U.S. Application Data

(60) Provisional application No. 62/144,419, filed on Apr. 8, 2015.

(51) Int. Cl.
*G01N 1/40* (2006.01)
*G01N 15/02* (2006.01)
(Continued)

(52) U.S. Cl.
CPC ........... *B01L 3/502776* (2013.01); *B01L 3/00* (2013.01); *B81B 7/00* (2013.01); *B81B 7/0038* (2013.01);
(Continued)

(58) Field of Classification Search
CPC .......... G21K 1/006; G01N 1/40; G01N 15/02; G01N 2015/0288; G01N 2015/1081;
(Continued)

(56) References Cited

U.S. PATENT DOCUMENTS

2004/0011974 A1* 1/2004 Matsuda ............ G01N 15/1436 250/574
2006/0163463 A1* 7/2006 Grier ................. B01L 3/502715 250/251
(Continued)

FOREIGN PATENT DOCUMENTS

GB 2408587 A * 6/2005 ............. G02B 21/32

*Primary Examiner* — Herbert K Roberts
(74) *Attorney, Agent, or Firm* — Valauskas Corder LLC

(57) ABSTRACT

The present disclosure provides for a system and method of concentrating airborne particles, specifically toward the center of one or more intake channels of PM sensors. The invention provides a simple and cost effective device that, when used in conjunction with a MEMS PM sensor or the like, can increase the sensitivity of said device by orders of magnitude. An in-line MEMS PM concentrator uses a converging optical intensity field to concentrate particulate matter along the center of a longitudinal axis of a microchannel. More specifically, the concentrator is designed to bring in ambient air containing PM through a microchannel and concentrate the PM in the center of the microchannel using a converging optical intensity field within a confocal optical cavity.

16 Claims, 19 Drawing Sheets

(51) Int. Cl.

| | |
|---|---|
| ***B01L 3/00*** | (2006.01) |
| ***G01N 1/22*** | (2006.01) |
| ***G01N 5/00*** | (2006.01) |
| ***B81B 7/00*** | (2006.01) |
| ***G01N 15/06*** | (2006.01) |
| ***G21K 1/00*** | (2006.01) |
| ***G01N 27/62*** | (2006.01) |
| *G01N 15/00* | (2006.01) |

(52) U.S. Cl.
CPC ............. *G01N 1/2202* (2013.01); *G01N 1/40* (2013.01); *G01N 5/00* (2013.01); *G01N 15/02* (2013.01); *G01N 15/0606* (2013.01); *G01N 15/0625* (2013.01); *G01N 27/62* (2013.01); *G21K 1/006* (2013.01); *G01N 2001/2223* (2013.01); *G01N 2015/0046* (2013.01)

(58) Field of Classification Search
CPC ..... G01N 2015/1415; G01N 2015/149; G01N 2015/1493
See application file for complete search history.

(56) References Cited

U.S. PATENT DOCUMENTS

| | | | | |
|---|---|---|---|---|
| 2008/0316481 | A1* | 12/2008 | van den Engh | G01N 15/1434 356/317 |
| 2009/0170186 | A1* | 7/2009 | Wu | B03C 5/026 435/286.1 |
| 2011/0085166 | A1* | 4/2011 | Ou-Yang | B01L 3/502761 356/338 |
| 2011/0216322 | A1* | 9/2011 | Moriya | G01N 15/0205 356/433 |
| 2014/0220557 | A1* | 8/2014 | Hart | G01N 33/4833 435/6.1 |
| 2014/0367315 | A1* | 12/2014 | Gluckstad | G02B 21/32 209/552 |
| 2015/0115174 | A1* | 4/2015 | Chen | G01N 15/1459 250/458.1 |
| 2016/0299045 | A1* | 10/2016 | Henspeter | G01N 33/4833 |
| 2018/0010997 | A1* | 1/2018 | Curry | G01N 15/1459 |

* cited by examiner

SYSTEM AND METHODS OF CONCENTRATING AIRBORNE PARTICLES

CROSS-REFERENCE TO RELATED APPLICATIONS

This application claims priority to U.S. Provisional Patent Application No. 62/144,419 filed Apr. 8, 2015, incorporated by reference.

BACKGROUND OF THE INVENTION

More than two decades ago, epidemiologists began showing that increased exposure to airborne particulate matter (PM) leads to increased morbidity and mortality. By the end of 2011, teams of investigators across the United States had shown that exposure to PM increased incidence of numerous conditions including cardio-pulmonary disease, neurological damage, compromised immune function, low birth weight and possibly diabetes.

Increased exposure assessment has been recommended to link health effects to where and when people receive exposure to PM, with considerable attention to susceptible populations such as the elderly and people with chronic illnesses such as asthma. Extensive personal exposure assessment is needed to address environmental justice issues that increase the vulnerability of people who live near PM sources such as highways and/or in congested urban areas.

PM generally refers to a mixture of solid and liquid droplets suspended in air. PM includes various airborne pollutants such as dust, smoke, diesel exhaust, smog, ash and the like. PM can range in size from less than 2.5 μM to at least 10 μM in diameter, where fine particles (2.5 μM in diameter or less) being especially dangerous to a person's health due to the ability of the fine particles to pass thorough conventional air filters and to penetrate the body's natural filtering mechanisms, thereby entering the lungs and bloodstream. As such, having a mechanism to accurately measure PM concentrations can help identify sources of PM, as well as provide feedback in instances where reduction practices of PM are currently in use or are being tested.

While significant progress has been made in improving PM sensors, existing PM sensors used to measure PM concentration tend to be expensive and bulky, rendering them unable to provide detailed measurement information relevant to personal PM exposure at varied locations. Even with the more recent development of small scaled PM sensors, these still suffer from being too large to allow large-scale deployment as personal PM monitors.

Accordingly, there is a need for a device and method to improve the sensitivity of a current PM sensors that are user wearable, inexpensive and robust. The present invention addresses that need.

SUMMARY OF THE INVENTION

The present disclosure provides for a system and method of concentrating airborne particles, specifically toward the center of one or more intake channels of PM sensors. The invention provides a simple and cost effective device that, when used in conjunction with a MEMS PM sensor or the like, can increase the sensitivity of said device by orders of magnitude. An in-line MEMS PM concentrator is designed to bring in ambient air containing PM through a microchannel and concentrate the PM in the center of the microchannel using a converging optical intensity field within a confocal optical cavity.

In some embodiments, the in-line MEMS PM concentrator comprises at least one microchannel, at least one optical cavity disposed within the microchannel where the particulate matter is directed toward the center of the microchannel using an in-plane or out-of-plane optical intensity field, and an optical light source providing photons for a converging optical intensity field inside the optical cavity. In a preferred embodiment, the optical light source is a laser or laser diode. According to the invention, an "in-plane" optical field is when the light source is on the MEMS PM concentrator in the same plane as air flow within the channels and an "out-of-plane" optical field is when the light source is on the MEMS PM concentrator in the direction perpendicular to the air flow within the channels.

The optical cavity disposed within the microchannel is preferably created through the use of mirrors to focus the optical field from an optical light source in a converging optical intensity field. In some embodiments, the optical light cavity comprises at least two mirrors disposed on opposite sides of the microchannel. The mirrors are preferably concave cylindrical mirrors.

In other embodiments, the optical light cavity comprises a plurality of mirrors disposed along at least a portion of the length of the microchannel. In still further embodiments, the optical light cavity comprises a plurality of mirrors disposed along at least a portion of the length of the microchannel or the optical light cavity comprises at least a first continuous mirror and a second continuous mirror positioned opposite one another and disposed along the entire length of the microchannel.

In further embodiments, at least two mirrors are actuated mirrors, which can be manipulated to focus or tune an optical cavity. The actuation can be through electrostatic actuation, piezoelectric actuation, or thermal actuation.

In still further embodiments, the optical light cavity further comprises at least one of a refractive or diffractive elements to generate the converging optical intensity field. The refractive or diffractive element is preferably a mirror or lens. The mirror can be any one of a planar mirror, convex mirror and concave mirror, and the lens can be any one of biconvex, plano-convex, positive meniscus, negative meniscus, plano-concave, biconcave, planar, cylindrical, Fresnel, lenticular and gradient index lens.

In some embodiments, the PM concentrator further comprises a mass-sensing film acoustic resonator to receive concentrated PM.

In other embodiments where the MEMS PM concentrator uses a laser or laser diode, the laser or laser diode emits light with a power range of about 5 milliwatts to about 10 milliwatts. In other embodiments, the laser or laser diode emits light exerting an optical force of about 0.15 pico-newtons to about 15 pico-newtons on the PM.

In still further embodiments, the PM comprises a diameter range of about 100 nanometers to about 5 micrometer.

Also provided is a method of concentrating particulate matter comprising drawing air samples into at least one microchannel from an external environment, where the air samples comprise PM of varying size, applying photons from an optical light source to create at least one confocal optical cavity within a microchannel where the confocal optical cavity comprises a converging optical intensity field, and then passing the particulate matter through the confocal optical cavity where the converging optical intensity field converges or concentrates the particulate matter to the center of the microchannel.

In some embodiments, the method of concentrating particulate matter uses a laser or laser diode and the confocal optical cavity can comprise, for example, at least two mirrors disposed on opposite sides of the microchannel. In some instances, the optical cavity also comprises at least one of a refractive or diffractive element to create the converging optical intensity field within the confocal optical cavity.

In other embodiment of the method, PM having a diameter size of X is concentrated to the center of the microchannel to a greater extent than PM having a diameter size of 2X, or 3x or 4x etc.

BRIEF DESCRIPTION OF THE DRAWINGS

The preferred embodiments of the invention will be described in conjunction with the appended drawings provided to illustrate and not to the limit the invention, where like designations denote like elements, and in which.

DETAILED DESCRIPTION OF EMBODIMENTS OF THE INVENTION

Figure 1A:
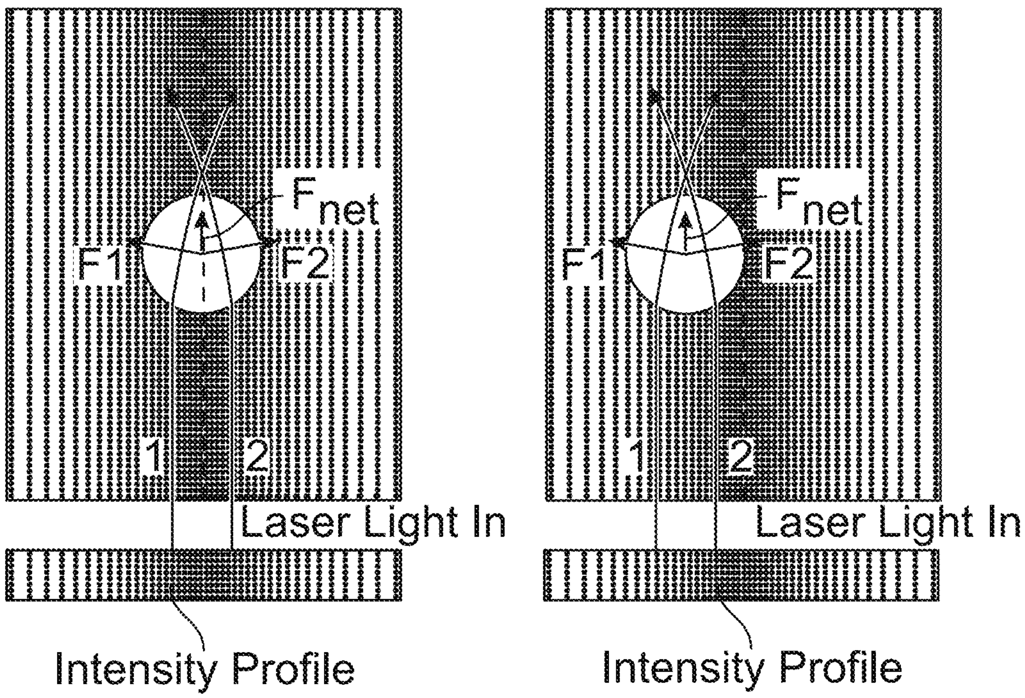
FIG. 1*a* illustrates a ray optics of a single-beam optical trap.

The present disclosure provides for a system and method of concentrating airborne particles, specifically toward the center of one or more intake channels of PM sensors. The invention provides a simple and cost effective device that, when used in conjunction with a MEMS PM sensor or the like, can increase the sensitivity of said device by orders of magnitude. An in-line MEMS PM concentrator uses a converging optical intensity field to concentrate particulate matter along the center of a longitudinal axis of a microchannel. More specifically, the concentrator is designed to bring in ambient air containing PM through a microchannel and concentrate the PM in the center of the microchannel using a converging optical intensity field within a confocal optical cavity.

The concentrator generally comprises a microchannel disposed in a suitable substrate and having at least one optical cavity disposed within the microchannel such that air drawn into the microchannel having a mixture of particulate matter particles passes through the optical cavity. A converging optical intensity field provided by an optical light source acts on the particulate matter particles to concentrate the particles along a center axis of the microchannel. The optical cavity may comprise one or more pairs of mirrors, as well as a refractive or diffractive element such as a mirror or lens.

In other situations, embodiments of the present disclosure may be used as a separation tool for PM, wherein PM of a smaller size diameter is concentrated or guided to the center or a microchannel more efficiently, or to a greater extent than a PM of a larger size diameter. The device may also be used to guide PM to a discrete location within a PM sensor, such as into another microchannel and thereby removing PM with a target size diameter from the airflow; or the PM may be guided to a mass reading sensor and deposited on said sensor.

The concentration or guiding of PM is achieved by establishing an optical intensity field where the highest intensity of the field is at the center of microfluidic channel and extends along the length of the channel through a plurality of optical cavities disposed throughout the microchannel. The methods and apparatus are best employed as or in conjunction with Micro-Electro-Mechanical Systems.

Micro-Electro-Mechanical Systems, or MEMS, is a technology that can be generally defined as miniaturized mechanical and electro-mechanical elements (i.e., devices and structures) that are made using various techniques of microfabrication. MEMS devices come in various sizes, the physical dimensions typically vary from well below one micron to many millimeters. Moreover, the types of MEMS devices can vary from relatively simple structures having no moving parts, to complex electromechanical systems with multiple moving parts under the control of integrated micro-electronics. Fundamental to a MEMS device is that there are at least some elements having mechanical functionality. Some examples of MEMS devices include, but are not limited to accelerometers and MEMS gyroscopes in remote controlled, or autonomous, helicopters, planes, used for automatically sensing and balancing flying characteristics of roll, pitch and yaw; MEMS gyroscopes used in cars and other applications to detect yaw; e.g., to deploy a roll over bar or trigger electronic stability control; MEMS micro-phones in portable devices; pressure sensors such as car tire pressure sensors, and disposable blood pressure sensors; digital micro-mirror device (DMD) chip based on DLP technology, which has a surface with several hundred thousand micro-mirrors or single micro-scanning-mirrors; Optical switching technology; interferometric modulator display (IMOD) applications in consumer electronics; and Bio-MEMS applications in medical and health related technologies from Lab-On-Chip to MicroTotalAnalysis (biosensor, chemosensor), or embedded in medical devices. The PM concentrator can be particularly useful in emissions testing, industrial manufacturing, chemical sensing, air quality assessment and environmental monitoring. By way of example, the present disclosure may be useful in various bio-MEMS sensors such as a direct read MEMS PM sensor.

One example of direct read mass MEMS PM sensor is disclosed in U.S. Pat. No. 8,806,915. Although the known direct-read mass MEMS PM sensor showed very promising initial performance (1-2 μg/m3 low-end sensitivity), its performance is hampered by two potentially inherent limitations to air-microfluidic circuits: 1) wall losses and 2) low efficiency due to residence time over the mass-sensing element. The increased surface to volume ratio of the channels and the particles of interest promote increased wall losses. Charging during the entry to the channels as well as particle generation can promote agglomeration of particles both on the conductive or insulating parts of the channel. This effect is specifically apparent in microfabricated virtual impactors (VIs) with particles close to the cutpoint.

Furthermore, in MEMS PM sensors, only 1%-3% of particles are actually deposited onto a mass-sensing element, due to a) the width of the mass-sensing element being considerably smaller than the width of the channel, and b) the residence time of PM underneath a thermophoretic heater allows only the particles in the lower portion of the channel to deposit on the mass sensor. Both limitation will be overcome if a method to concentrate particles inside the microfluidic channels (e.g. towards the channel center) is used. An inline PM concentrator as described constitutes enabling technology for air-microfluidic circuits. For example, the sensitivity of a direct-read mass PM sensor would be increased by two orders of magnitude if a concentrator would be incorporated into its channels.

In addition to increased sensitivity, the concentrator is advantageous in that it can reduce power consumption of the PM sensor by significantly reducing or potentially eliminating the power dissipated by a thermophoretic heater. The concentrator can focus PM at a specific location within the channel, and as a result, a much weaker temperature gradient can be used to move the particles to a mass-sensing resonator. It is also possible that the optical concentrator can be used to deposit particles onto the mass sensing resonator. The concentrator may also reduce the cost of fabricating the PM sensor by relaxing some of the process parameters, e.g. reducing the need for smooth channel walls, and allowing for a less expensive process to be used.

Although, the first speculations about the mechanical effects of light began in the 17th century when astronomer Johannes Kepler suggested that comets' tails were pushed away from the Sun by the pressure of light, utilization of optical forces to manipulate small objects had not been suggested until 1970 by Arthur Ashkin. Ashkin demonstrated that by using a moderately focused laser beam micro-objects can be pushed on the surface of a liquid or even levitated in the air. Currently, optical tweezers are important research tools in fields of biology, chemistry, physics, etc. Optical tweezers use a highly focused laser beam to trap, move, and manipulate objects as small as 5 nm or as big as tens of micrometer.

Even though the theory behind the optical tweezers is still being developed, a basic explanation can be given to describe the principle behind working of these tools. If one considers the conservation of momentum, it can be observed that the photons that are absorbed or scattered by the dielectric particle transfer momentum to that particle in such a way as to propel the particle to the highest light intensity point (focal point).

Figure 1B:
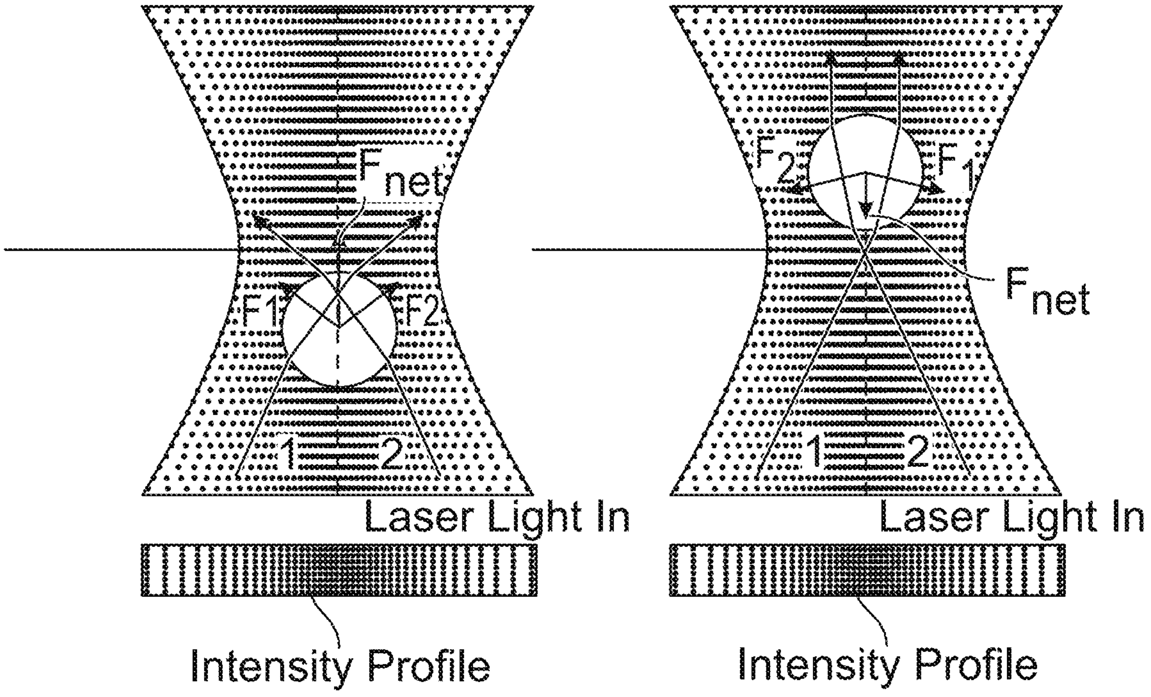
FIG. 1*b* illustrates another ray optics of a single-beam optical trap.

As shown in FIG. 1*a*, an out of center particle (right image) causes a larger momentum change of the more intense rays causing a net force to be applied back toward the center of the laser. FIG. 1*b* illustrates the momentum change of the focused rays causing a force towards the laser focus.

Although conventional optical tweezers have already been used to trap single aerosol particle in the air, manipulation of multiple particles in the air has yet to be achieved. Conventional optical tweezers propel the particle toward the focal point of a tightly focused laser light ("a point"). To be able to manipulate multiple particles with the same light beam, the light intensity has to be in engineered in such way that the highest intensity point is extended to a line.

Accordingly, to direct particles towards the center of a microchannel channel (FIG. 2), an optical intensity field is designed in such a way that the highest intensity field is placed at the center of the channel and this highest intensity field is extended along the length of the channel. This is accomplished through optical cavities extending along the length of the microchannel.

Figure 3:
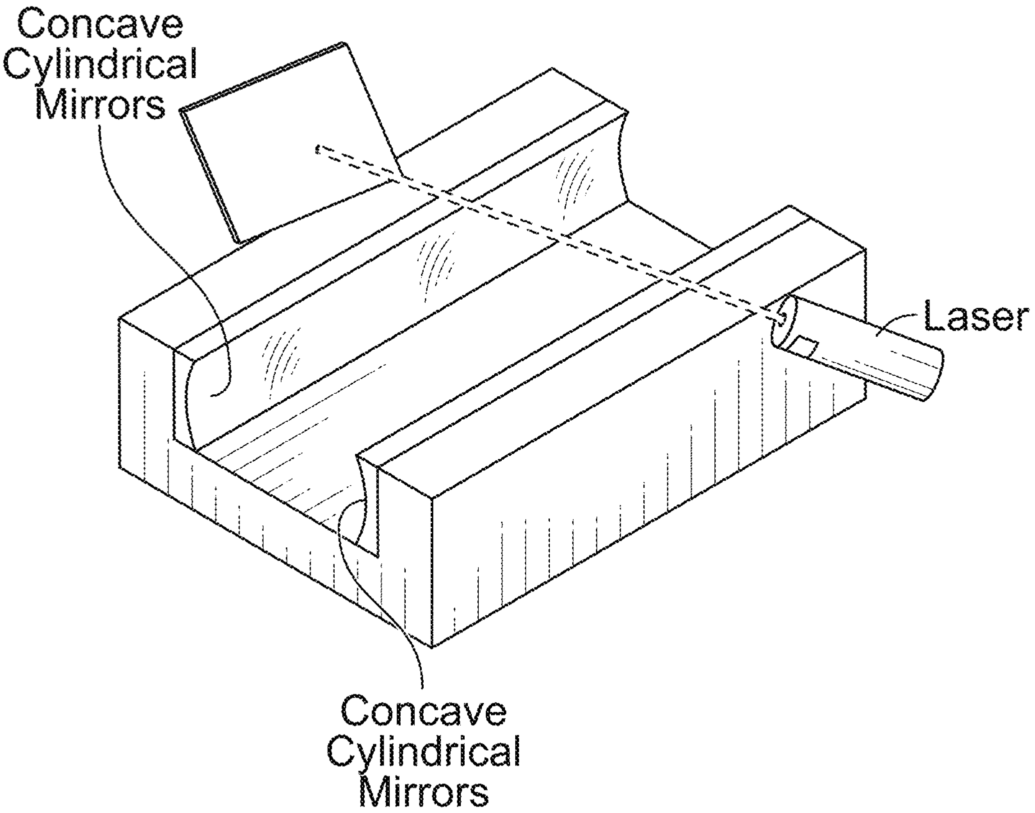
FIG. 3 illustrates an optical cylindrical confocal cavity design and laser source.

An optical field (and resulting force field) can be generated by using microfabricated mirrors in the flow path of a laser beam (see FIG. 3). An optical field may also be generated by using refractive or diffractive optical elements in the path of the laser.

Figure 2:
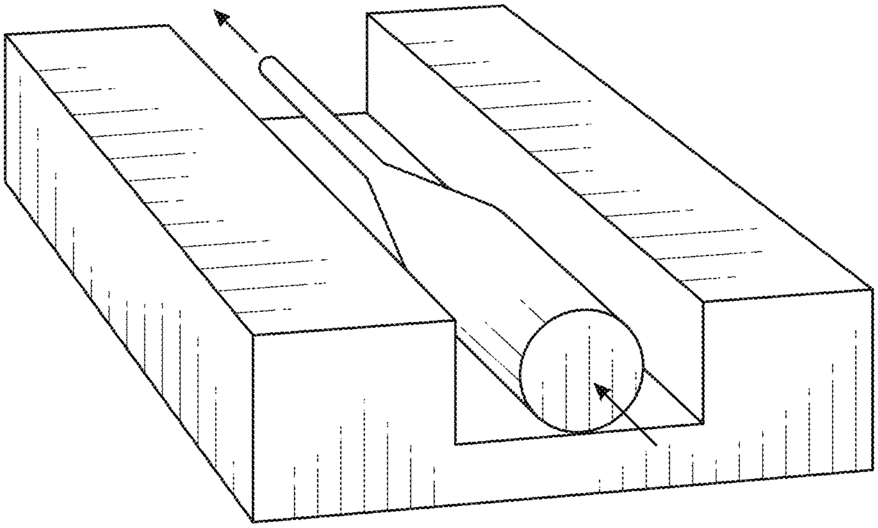
FIG. 2 illustrates converging particle trajectory inside an air-microfluidics channel.

As shown in FIG. 2, an embodiment of the disclosure comprises a body or substrate having at least one micro channel and at least one optical cavity disposed therein, and an at least one optical light source. The optical cavities are generally formed through the use of mirror pairs or other suitable reflective elements disposed on, or integral to the sides of the microchannel.

A mirror, or other suitable reflective material for use with present disclosure can be plane, concave, convex or other shape depending on the applications. A plane mirror forms a Fabry-Perot cavity. A curved mirror forms a plane-convex or plane-concave cavity. The mirror may also be a metal coated aperture face of an optical fiber.

In some embodiments, at least a portion of a channel may be constructed to fit at least two planar, concave or convex mirrors. In other embodiments, the mirrors are situated opposite one another lining the length of the channel. In other embodiments, at least 1, 2, 3, 4, 5, 6, 7, 8, 9, 10 or more mirror pairs are situated in the fluid channel and are parallel, or substantially parallel to one another. In still further embodiments, mirrors may be situated along the entire length of a channel, or just a portion thereof. In one embodiment the converging optical intensity field is fabricated through an optical cavity comprising concave cylindrical mirrors on both sides of microchannels wherein the mirrors are opposite one another. The mirrors are generally positioned on opposite sides of a microchannel to reflect laser photons back and forth between the mirrors, thus forming an optical field in the optical cavity or optical resonator within the microchannel. In other embodiments, a first and second continuous mirror on opposite sides of the microchannel form the optical cavity. The continuous mirrors may be positioned along at least a portion of the sides of the microchannel, while in some embodiments, the continuous mirrors are positioned along the entire length of the sides of the microchannels.

The mirrors can be either fabricated separately, then disposed into the microchannels, or the mirrors can be fabricated in situ inside the microchannels. The mirrors can be either fixed, or their surface can be actuated to focus the optical cavity. The actuation can be either electrostatic, piezoelectric, or thermal. Examples of suitable arrays of actuated mirrors may include digital light processing (DLP) arrays made by Texas Instruments and 1×128 mirror arrays made by Advanced Micro Devices (AMD), and as disclosed in U.S. Pat. Nos. 9,207,541; 5,710,657; 5,696,618; 6,822,370; 6,480,645; U.S. Pat. Pub. No. US20140139816, US20040075881.

In other embodiments, the PM concentrator further employs at least one diffractive or refractive elements. The diffractive or refractive elements are preferably a mirror or lens including wherein the mirror is selected from the group consisting of a planar mirror, convex mirror and concave mirror, and the lens is selected from the group consisting of biconvex, plano-convex, positive meniscus, negative meniscus, plano-concave, biconcave, planar, cylindrical, Fresnel, lenticular and gradient index lens.

In still further embodiments, a diffractive or refractive element is a surface covered with a reflective material such as a metal (e.g. gold, silver etc.). Each PM concentrator may contain multiple diffractive or refractive elements used to provide the optical field from an optical light source to the optical cavities.

FIG. 3 demonstrates an optical source shining into an optical cylindrical confocal cavity. In some embodiments, the optical source is a laser or laser diode. According to the invention, a "laser" refers to an electronic-optical device that emits coherent light radiation. A typical laser emits light in a narrow, low-divergence monochromatic (single-colored, if the laser is operating in the visible spectrum), beam with a well-defined wavelength. In this respect, laser light is in sharp contrast with such light sources as the incandescent light bulb, which emits light over a wide area and over a wide spectrum of wavelengths. The term "laser" further includes any laser that is currently available or may become available that can provide the appropriate pulse duration, power, and pulse frequency required by the methods of the instant invention. Currently available lasers that can be used in the methods of the invention include, but are not limited to gas vapor lasers, metal vapor lasers, pulse dye lasers, chemical, solid state lasers, semiconductor diodes, and fiber lasers.

Figure 4A:
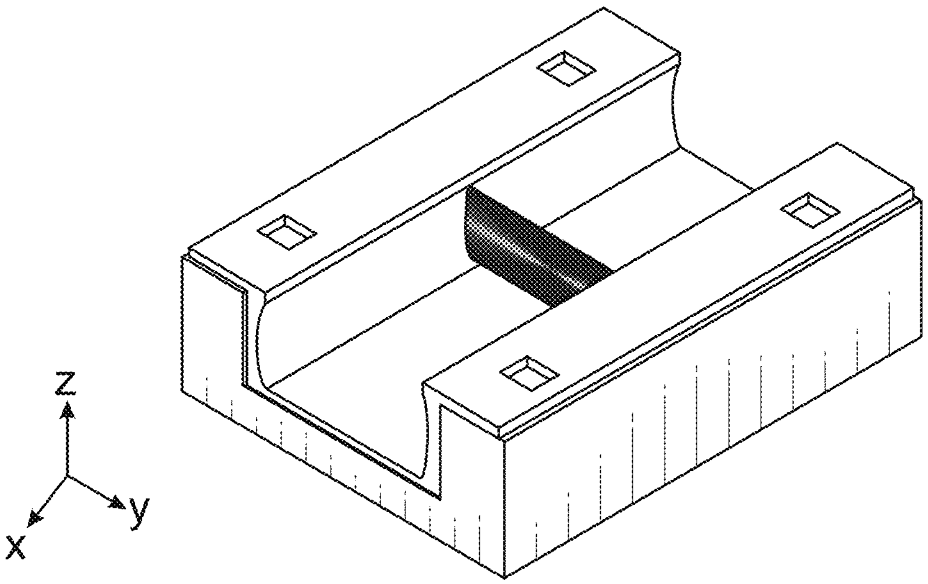
FIG. 4*a* illustrates an optical cylindrical confocal cavity design incorporated inside the microchannels and optical intensity profile inside this cavity.
Figure 4B:
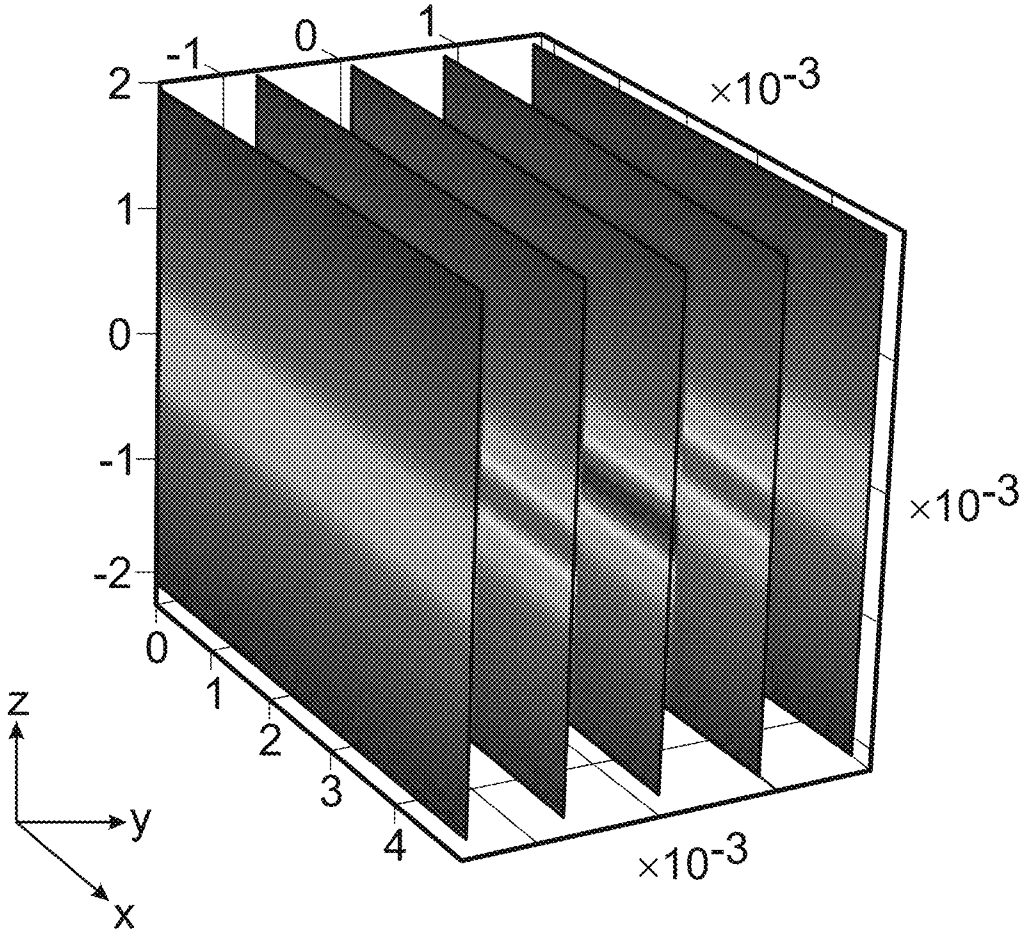
FIG. 4*b* illustrates an optical intensity field inside a cylindrical confocal cavity.
Figure 4C:
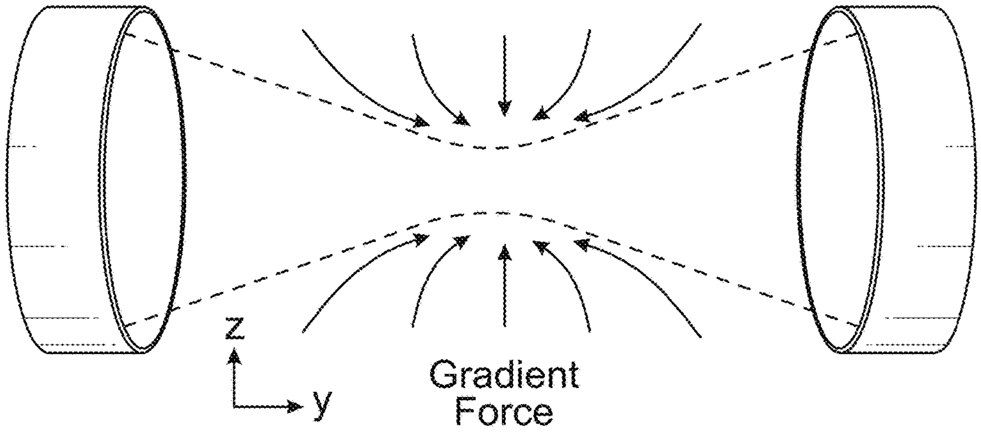
FIG. 4*c* illustrates an optical field intensity inside a confocal optical cavity and the gradient force associate with this light intensity profile.

FIG. 4*a* illustrates an optical cylindrical confocal cavity design incorporated inside the microchannels and optical intensity profile inside this cavity. FIG. 4*b* illustrates the optical intensity field inside a cylindrical confocal cavity and FIG. 4*c* illustrates the optical field intensity inside a confocal optical cavity and the gradient force associate with this light intensity profile.

The laser can be of a single wavelength laser or a multi-wavelength laser. Persons skilled in the art will be aware that various laser energy sources are known in the art. Suitable lasers include, for example, Helium-Neon, Xenon-Chloride, Xenon-Fluoride, Helium-Cadmium, Rhodamine, Copper Vapor, Argon, Frequency Doubled Nd:YAG, Krypton, and Ruby lasers and also semiconductor diode lasers, examples of which are disclosed in U.S. Pat. Nos. 7,551,653, 6,413,267 and 6,395,016. Additionally, it may be advantageous to utilize at least one laser beam in the visible energy spectrum so that the operator can see and direct the laser light to the desired location. Diodes of various other wattages may also be employed to achieve the desired laser energy for the given regimen.

The laser light can be delivered to the device either directly or via optical transmission fiber.

The color of light emitted by a laser is determined by the wavelength traveled by its photons: a shorter wavelength corresponds with higher energy deliverance. The optical light source can further be integral to the PM concentrator, or provided as an external source.

The optical intensity field, as supplied by the optical light source (e.g. a laser or laser diode), inside the optical cavity and the force associated with that is shown in FIG. 4. With this method, both optical gradient force and radiation pressure are collinear and could result in a stronger force. Also, due to the cavity based nature of the concentrator (i.e. photons travel back and forth between two mirrors), the number of collisions between photons and particles is increased which leads to higher concentration power for the same optical power. As particles travel through the microchannel and reach the optical cavity, the particles will interact with some of the photons passing between the mirrors and be pushed towards the center of the microchannel where they are concentrated compared to the particle distribution prior to entering the optical cavity, or at a position upstream of the optical cavity. The distance that the particles are pushed toward the center of the microchannel is dependent on the diameter size of the particle. For example, a particle having a diameter of size X is concentrated to the center of the microchannel to a higher degree than that of a particle having a size diameter of 2x, or 3x, or 4x, or 5x, or 6x, or 7x, or 8x, or 9x, or 10 etc. (see FIG. 6, and 10-15).

By way of example, a PM concentrator as disclosed is operated by drawing fluid (e.g. an air sample) into a microchannel from an external environment where the fluid comprise PM of varying size. This is accomplished through the use of an air pump, air fan or the like. An optical light source provides photons to create at least one confocal optical cavity within the microchannel wherein the confocal optical cavity comprises a converging optical intensity field. The PM is passed though the at least one confocal optical cavity, where a converging optical intensity field concentrates the PM to the center of the microchannel, which is the focal point of the converging optical intensity field as set by the user. The mirrors or refractive/diffractive elements may be manipulated (e.g. through actuators, or manually) to focus the converging optical intensity field to a certain point in the microchannel, typically the center of the channel, but can be at any point in the microchannel. For instance, by focusing the converging optical intensity field and varying the amount of optical forces applied to concentrate PM at a position which is not the center of the microchannel, such as closer to one of the sides of the microchannel, PM of a certain size can be directed or guided down a separate microchannel, thereby concentrating or separating the PM.

Moreover, the use of the disclosed converging optical intensity field technology further provides for the separation of PM from a fluid having the same, similar, or substantially similar permittivities. For example, PM can be separated from fluid such as air.

Describing optical forces in an analytical expression in most cases is extremely difficult, except for limited number of situations with simplified object geometries and refractive index. The optical force must be calculated numerically when applying optical forces to many objects or when the objects have complex geometries. Assuming that the optical force incident on the object is linearly proportional to the laser power P, then $F_{opt}$ can be expressed as:

$$F_{opt} = \frac{n_1 P}{c_0} Q$$

Where $n_1$ is the refractive index of the surrounding medium, $C_0$ is the speed of light in a vacuum, and Q is the trapping efficiency factor that depends on the size, shape, material, and position of the particle with respect to the spatial profile of the beam. For normal incidence of a plane wave on a totally reflecting mirror, Q=2. In optical tweezers, the maximum value of Q is typically around 0.1-0.2 and is a measure of how well the optical momentum of the trapping light field couples to the sphere and incorporates factors such as aberrations in the trapping system (Dholakia et al., Chemical Society Reviews 37.1 (2008): 42-55.). For a system with the laser power of single milliwatts in the air (n1=1), optical forces the order of a pico-Newton (〖10〗^(−12)N) are expected.

Figure 5:
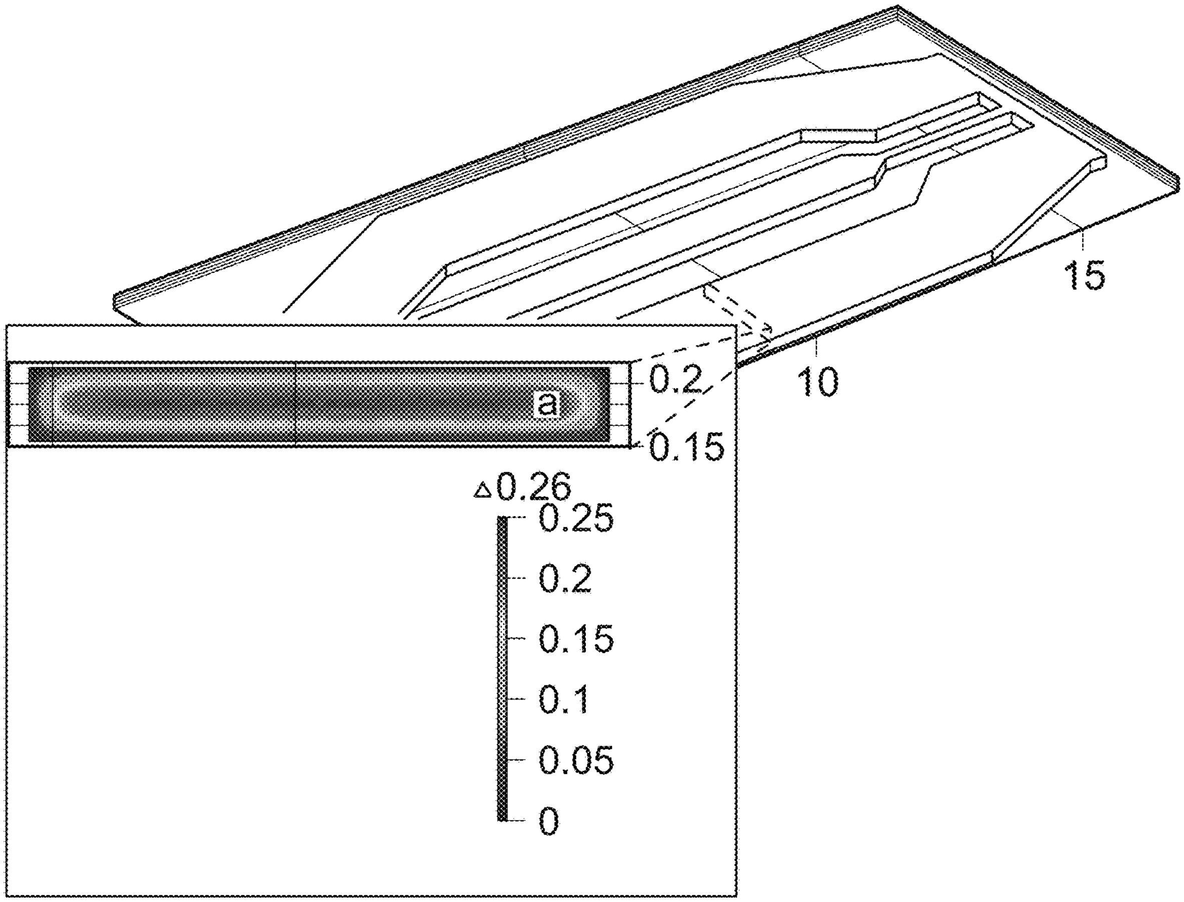
FIG. 5 illustrates a velocity field inside the major channel of PM sensor.

The transport of particles through an embodiment of a PM sensor is used as an example to examine the feasibility of applying optical forces to concentrate particles in the center of a microfluidic channel. The major channel, as shown in FIG. 5, is a rectangular shaped channel with depth of 200 μm and width of 1.7 mm. For the 6 mL/min flow through the PM sensor the maximum velocity of the particles is 0.3 m/s For the optical power to concentrate particles into the middle of the channel, the power must be sufficient to propel the particles positioned on either side of channel to the middle of channel within the length of the channel and be independent of the material composition (refractive index), shape, size, and the position with respect to the center of the channel. To evaluate converges of particles to the center of channel, under the worst case scenario, it was assumed that the particle had a refractive index close to 1 (weakest optical force), a large diameter (less acceleration for the same force), and positioned on point (a) (highest horizontal initial speed) in FIG. 5.

Figure 6:
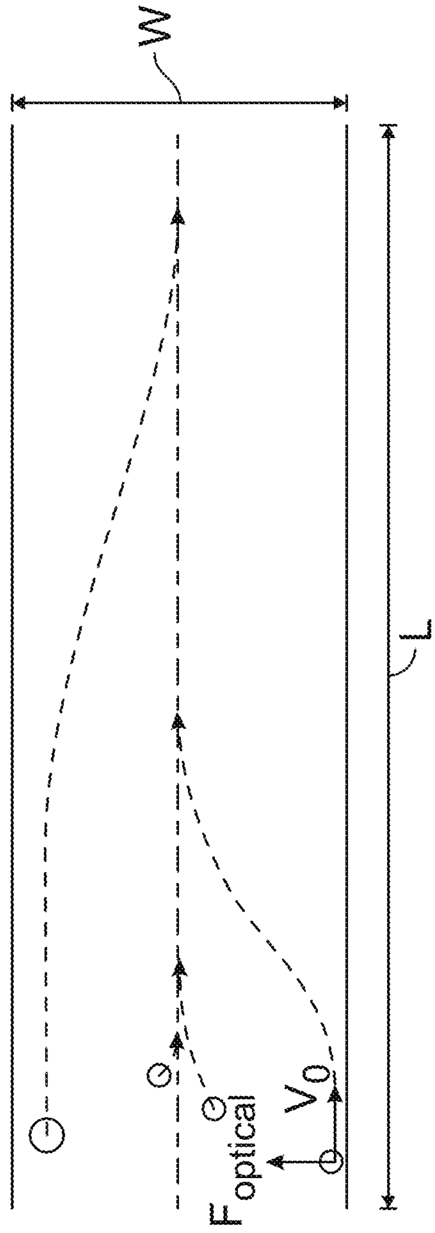
FIG. 6 illustrates trajectory of different (size, material, shape and position) particles under the optical force

FIG. 6 illustrates trajectory of different (size, material, shape and position) particles under the optical force. As shown, different particles get to the center of the channel at different lengths.

For a water droplet (n=1.33, close to 1) with diameter of 5 μm, it has been shown the Q to be 0.1±0.04, as a result the optical force is ≅3 pN for a laser beam with a power of 10 mW. Under this force, a 5 μm water droplet, with flow speed of 0.3 m/s and positioned 0.8 mm from the middle of the channel, reaches the center of the channel in t=6 ms, which corresponds to a length l=1.8 mm in the channel. It is clear that smaller and with higher refractive index would reach the center faster and because of the optical intensity profile (highest intensity in the center) once these particles are in the center of the channel the optical force exerted on them is neutral and they follow the same trajectory as the flow. Table 1 shows several examples of particles and their convergence length (the length at which they reach the center of the channel).

TABLE 1

Convergence length for particles of various sizes subject to 10 mW optical laser power.

| Particle Size [μm] | Refractive Index | Initial Position with respect to center of channel [mm] | Flow Speed [m/s] | Optical Force [pN] | Convergence Length [mm] |
|---|---|---|---|---|---|
| 5 | 1.33 | 0.8 | 0.3 | 3 | 1.8 |
| | 3 | 0.8 | 0.3 | 9 | 1.02 |
| | 5 | 0.8 | 0.3 | 15 | 0.8 |
| 1 | 1.33 | 0.8 | 0.3 | 0.4 | 0.43 |
| | | 0.4 | 0.3 | 0.4 | 0.3 |
| | | 0.84 | 0.05 | 0.4 | 0.08 |
| 0.5 | 1.33 | 0.8 | 0.3 | 0.15 | 0.25 |

In all cases, the calculated convergence length is below 2 mm, indicating that this approach can be applied within the PM sensor prototype. Furthermore, characteristic lengths below 2 mm makes it feasible to integrate the optical concentrator in an acceleration jet, as well as in the major and minor flow channels of a PM sensor (as in U.S. Pat. No. 8,806,915). Both these points strengthen the feasibility of using the optical PM concentrator to improve the collection efficiency of the of a PM sensor.

In addition to the close-form-solution feasibility study, the feasibility of concentration through numerical modeling was investigated. The first step is to numerically model the optical force corresponding to the optical field inside the cavity. The calculation of optical force, F, is based on integrating the Maxwell stress tensor $\sigma_{ij}$ over a surface enclosing the studied object (particles) as follows $$\langle F_i \rangle = \int_S \langle \sigma_i \rangle n_j dS$$

Where Maxwell stress tensor is defined as, $$\sigma_{ij} = \epsilon_0 E_i E_j + \frac{1}{\mu_0} B_i B_j - \frac{1}{2}\left(\epsilon_0 E^2 + \frac{1}{\mu_0} B^2\right)\delta_{ij}$$

Where $\langle F_i \rangle$ is the time averaged force in direction of i (x, y and z), E and B are electrical field and magnetic flux, and $\delta_{ij}$ is Kronecker delta.

Figure 7:
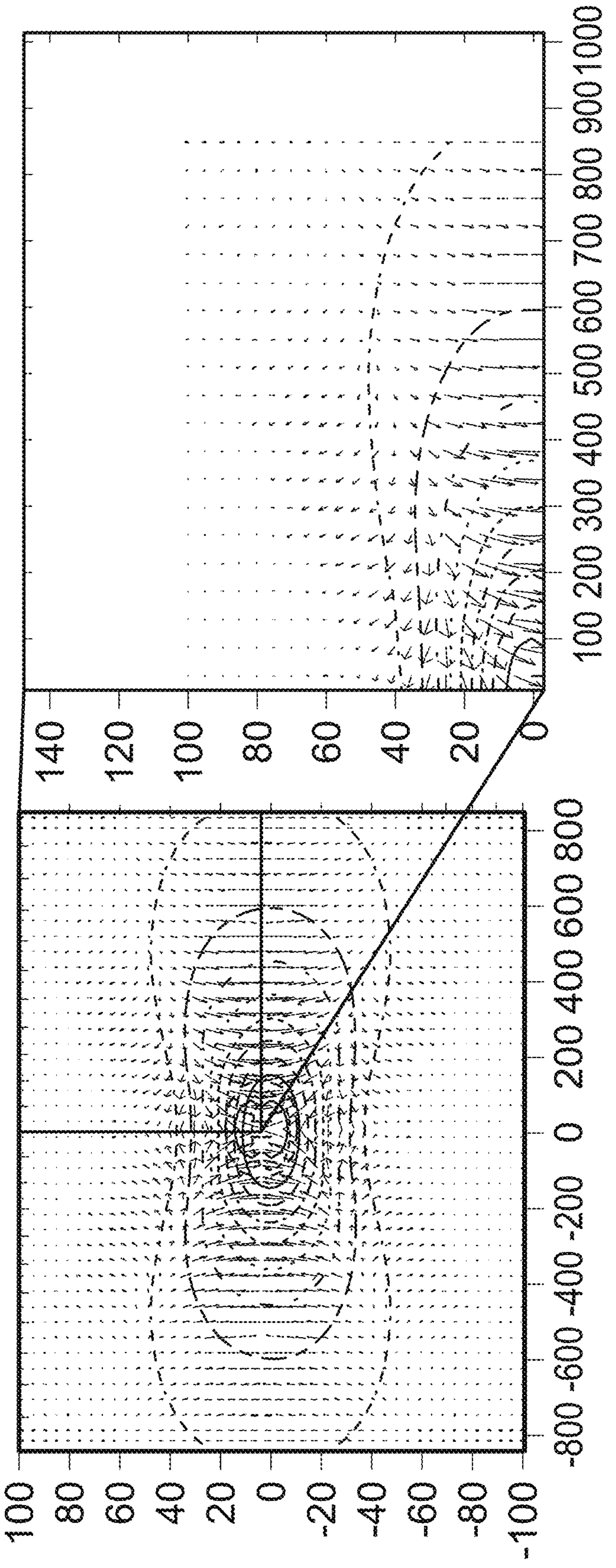
FIG. 7 illustrates a light intensity profile inside the designed confocal cavity and a zoom-in view of optical force vectors.

FIG. 7 illustrates a light intensity profile inside the designed confocal cavity and a zoom-in view of optical force vectors. The results show that peak of the force is about 28 pN at the point with the highest field gradient. Forces are calculated on a water particle (n=0.33) with diameter of 2.5 μm.

Figure 8A:
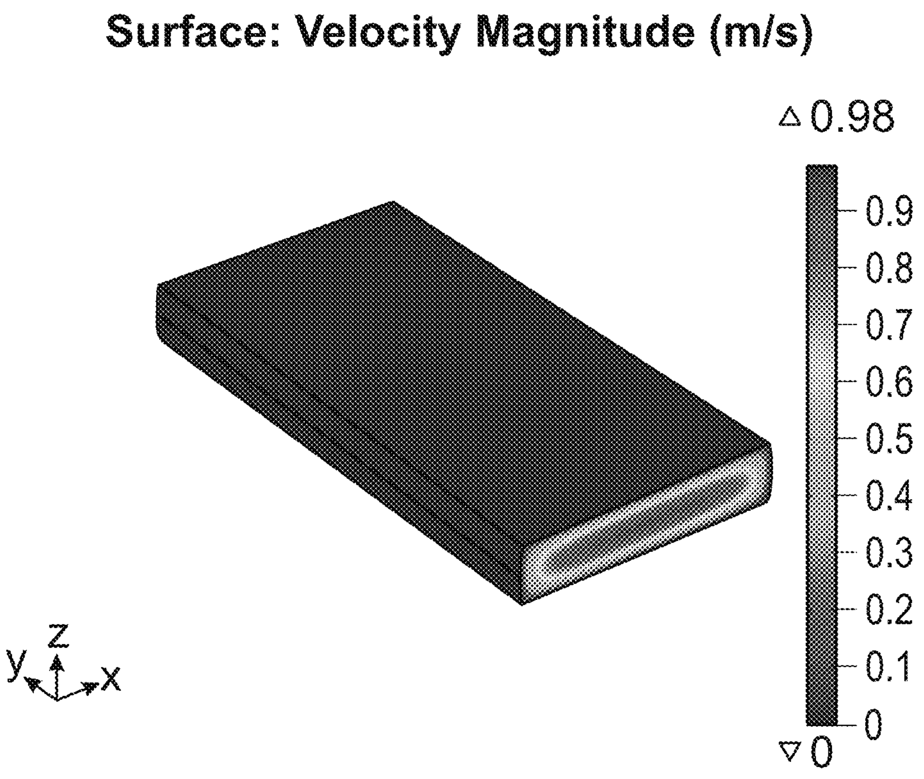
FIG. 8*a* illustrates a velocity profile across an optical concentrator.
Figure 8B:
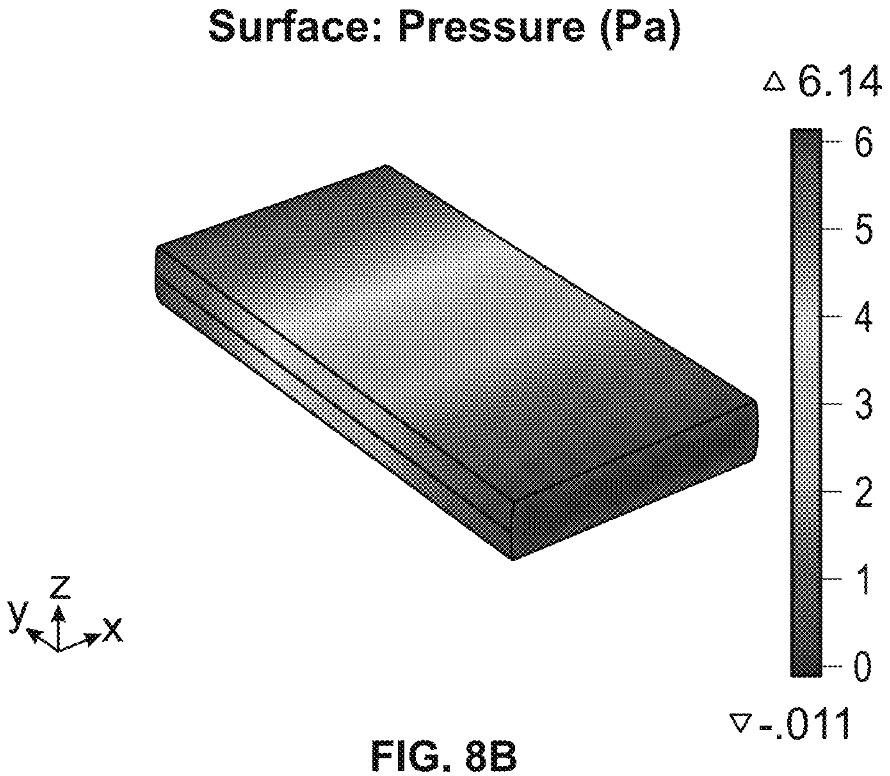
FIG. 8*b* illustrates a pressure drop across the optical concentrator.
Figure 9A:
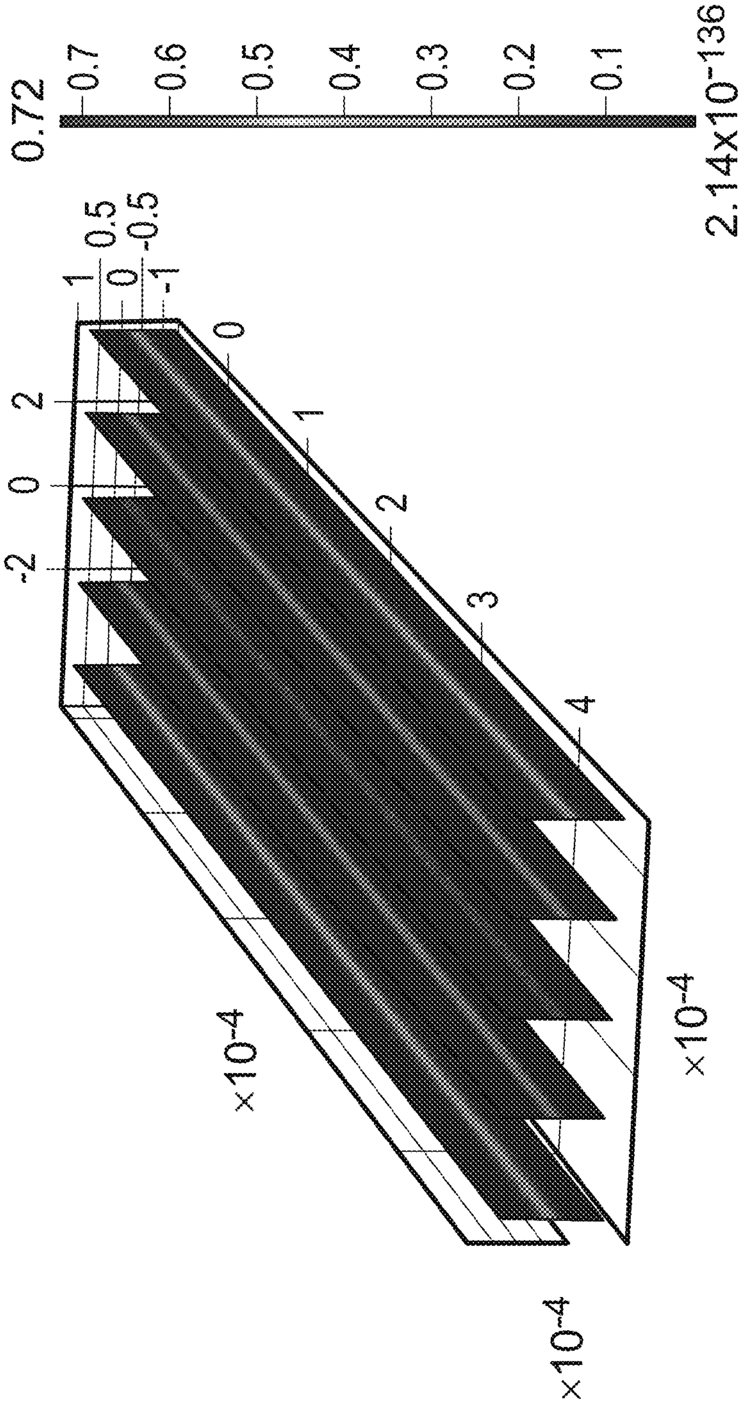
FIG. 9*a* illustrates an optical intensity inside the micro-optical concentrator.
Figure 9B:
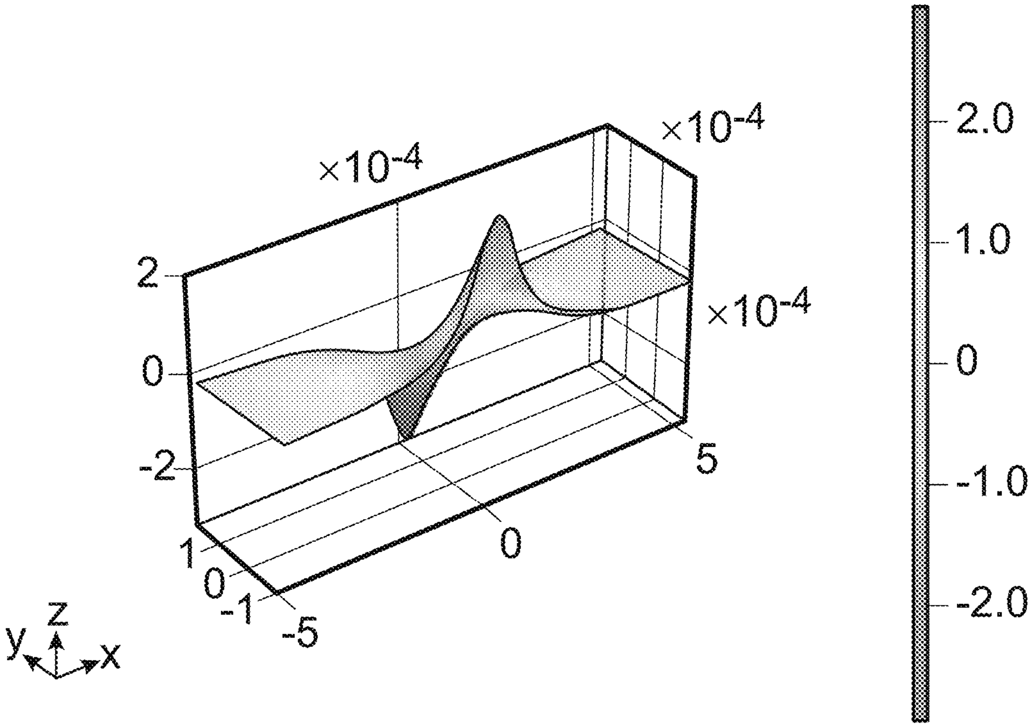
FIG. 9*b* illustrates vertical force distribution across the microchannel.
Figure 9C:
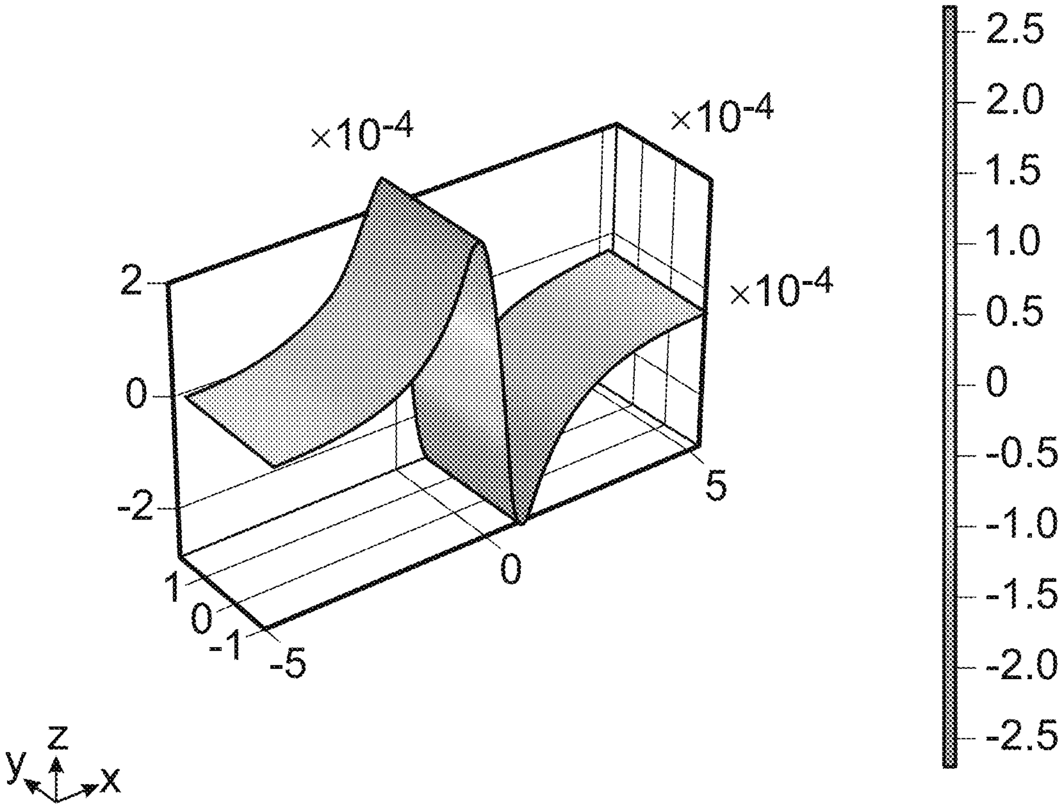
FIG. 9*c* illustrates horizontal force distribution across the microchannel.

Next, other forces inside the channel are incorporated, including drag force and gravity. This is accomplished through the Multiphysics capability of COMSOL, an interactive environment for modeling and simulating scientific and engineering problems. First the flow inside the channel has been modeled to calculate the drag force. Then the particle tracing module is used to find the trajectory of the particles when affected by optical, gravity, and drag forces. FIG. 8*a* illustrates a velocity profile and FIG. 8*b* illustrates a pressure drop across the optical concentrator. FIG. 9*a* illustrates an optical intensity inside the micro-optical concentrator. FIG. 9*b* illustrates vertical force distribution and FIG. 9*c* illustrates horizontal force distribution across the microchannel.

Figure 10A:
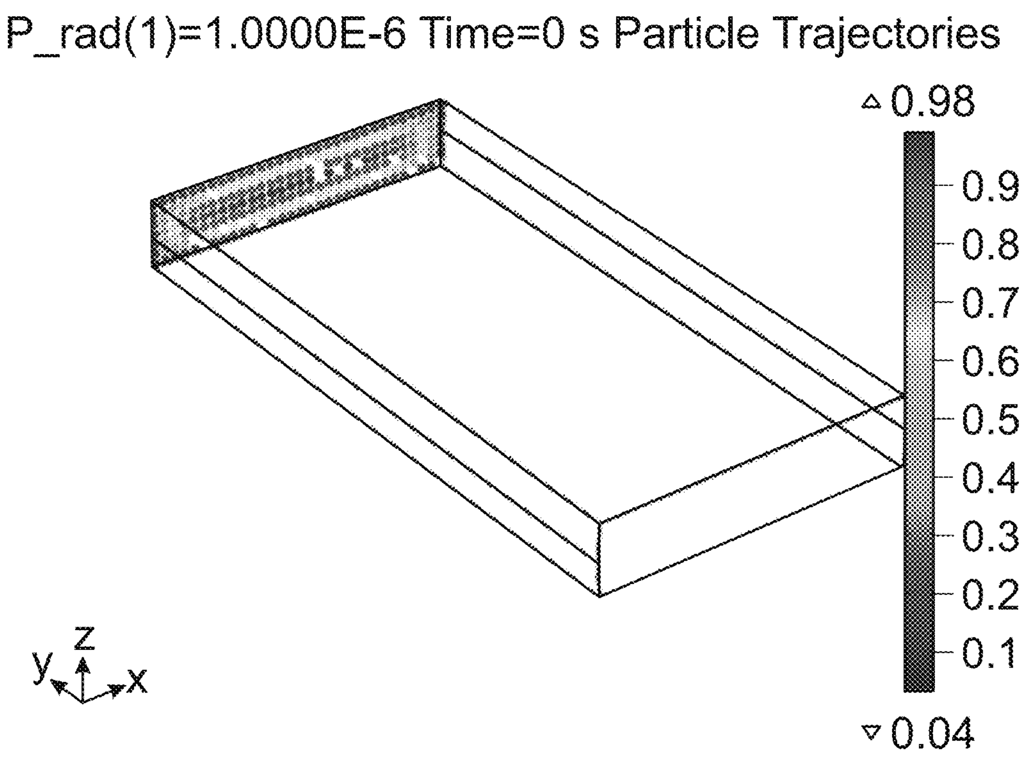
FIG. 10*a* illustrates a particle concentration at time zero entering the channel.
Figure 10B:
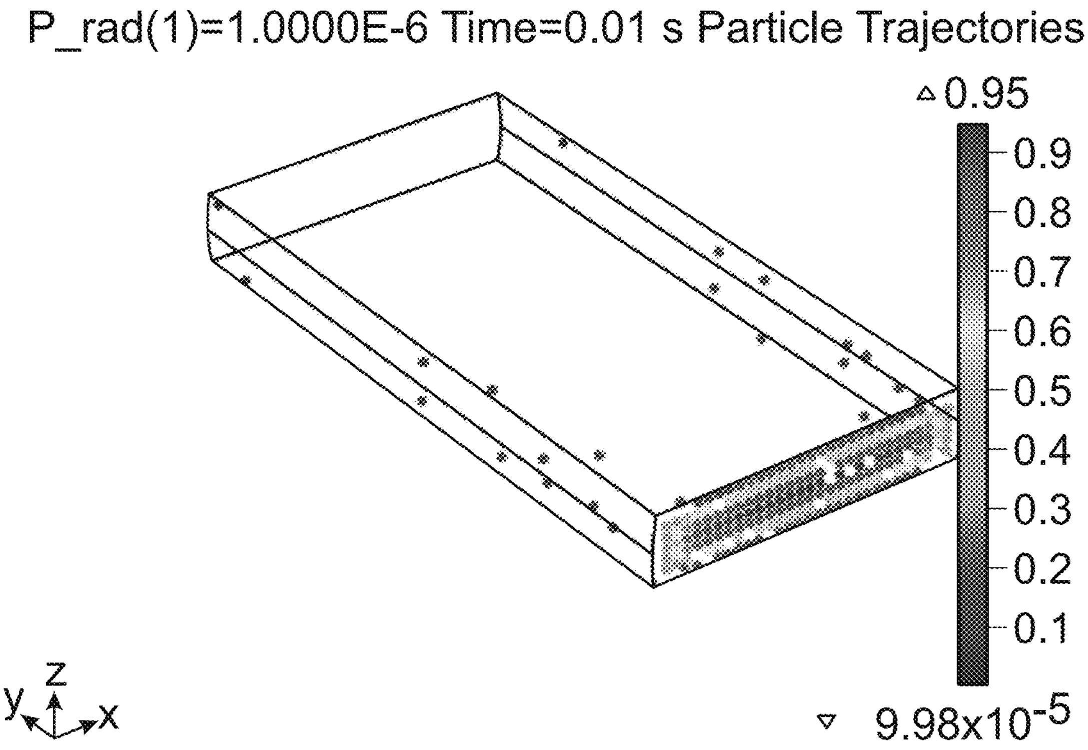
FIG. 10*b* illustrates the particle concentration at time 0.01 s exiting the channel without the effect of the optical forces.

The geometry of the model is shown in FIG. 10*a* and FIG. 10*b*. FIG. 10*a* illustrates a particle concentration at time zero entering the channel with the air velocity profile inside a channel shown as 2 mm×1 mm×200 μm. FIG. 10*b* illustrates the particle concentration at time 0.01 s exiting the channel without the effect of the optical forces. The flow was 6 mL/min with a pressure drop of 6 Pa.

A slice representation of the optical field inside the channel and the forces (on 1 μm water aerosol) associated with this optical field is shown in FIG. 11. FIG. 11, FIG. 12, FIG. 13, and FIG. 14 show the particle trajectory of particles inside the channel when the optical force is acting on the particles for particles with diameter of 5, 2.5, 1 and 0.1 μm respectively and also the distribution of the particles at the exit plane of the optical concentrator.

Figure 11A:
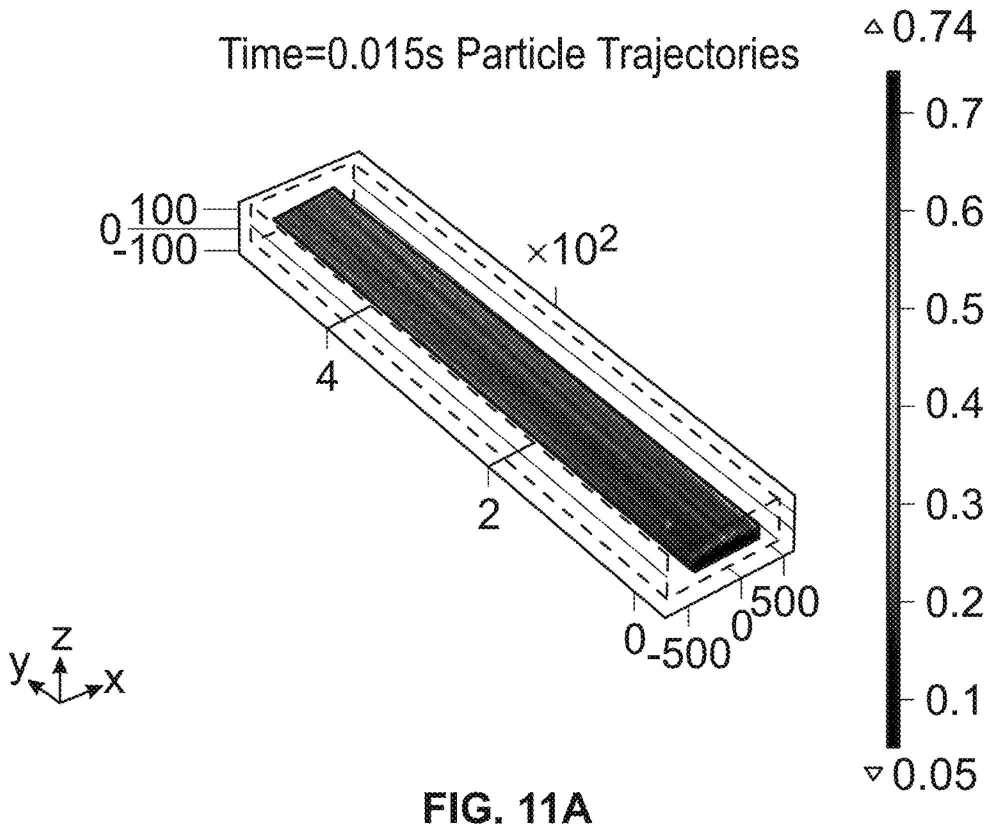
FIG. 11*a* illustrates a particle trajectory of 5 μm particles.
Figure 11B:
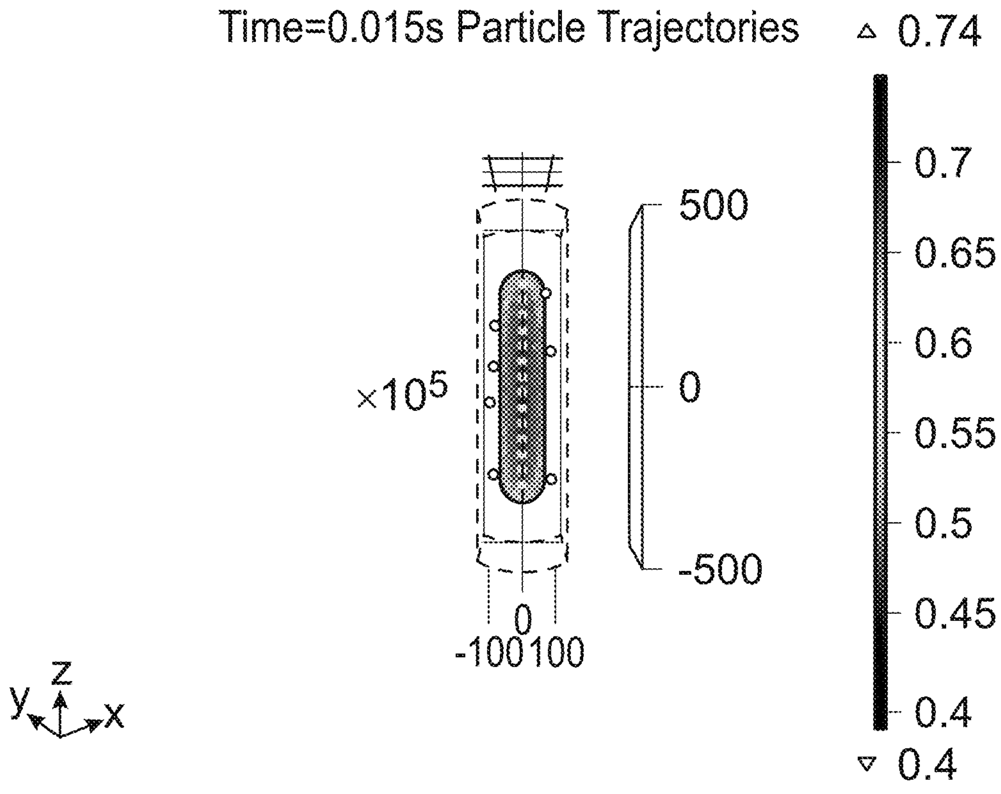
FIG. 11*b* illustrates distribution of the particles at the exit plane of an optical concentrator.
Figure 11C:
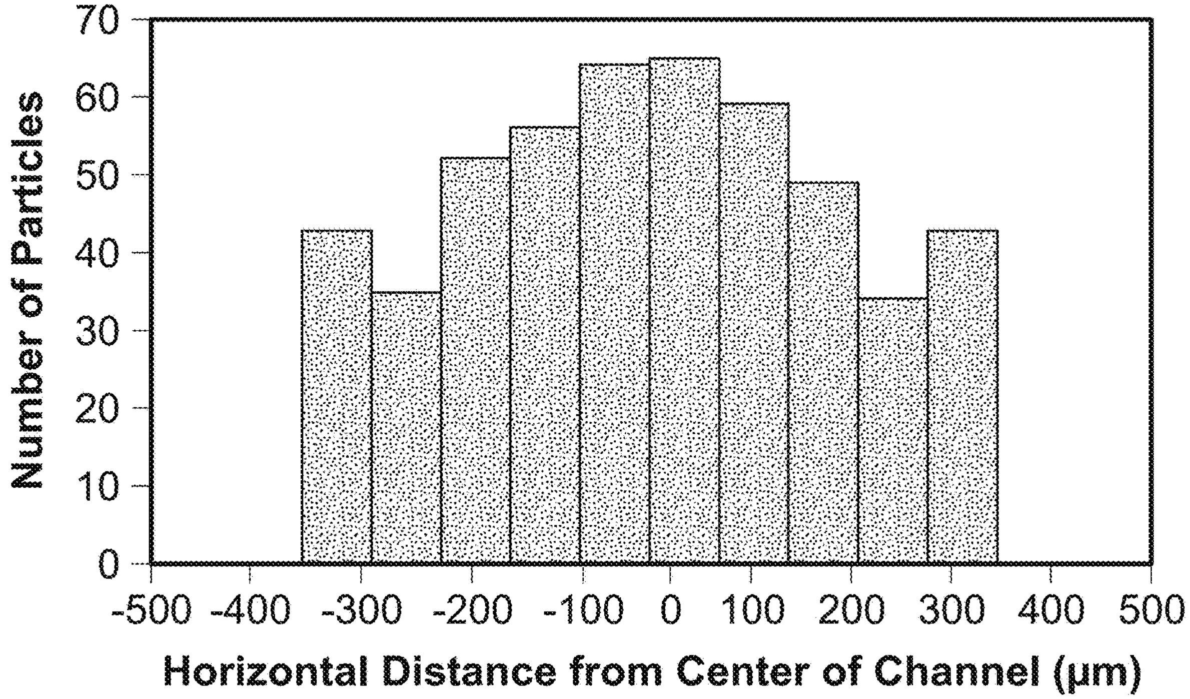
FIG. 11*c* illustrates a histogram plot of number particles across horizontal plane.
Figure 11D:
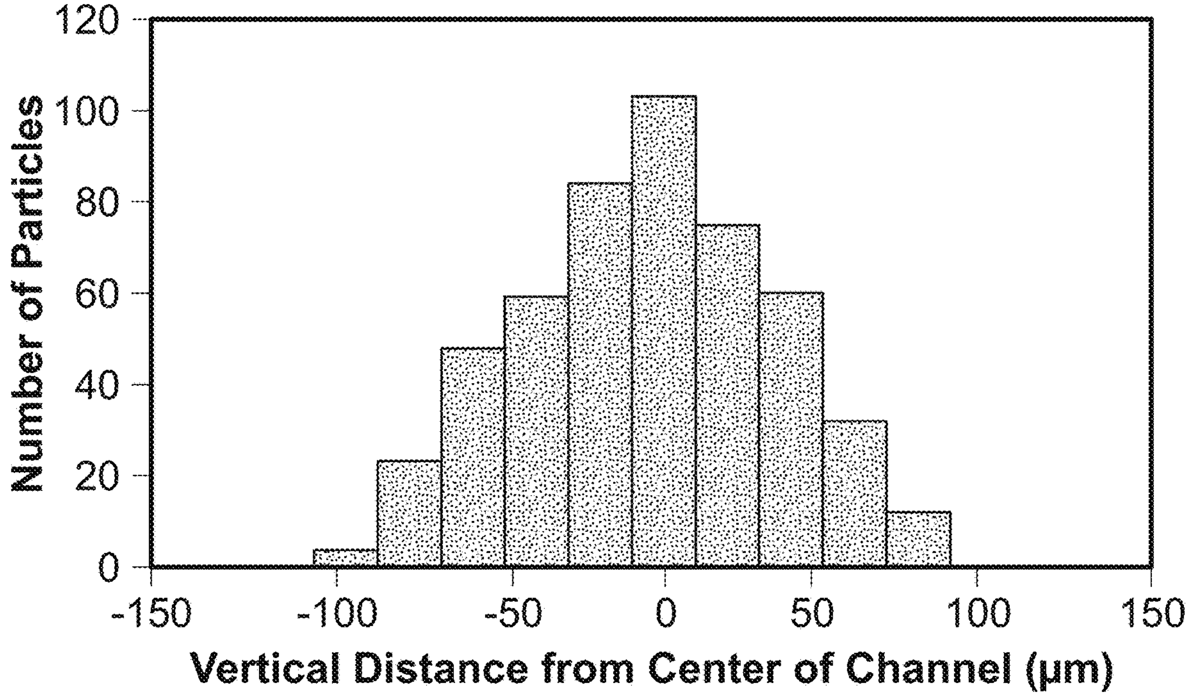
FIG. 11*d* illustrates a histogram plot of number particles across vertical plane.

Specifically, FIG. 11*a* illustrates a particle trajectory of 5 μm particles, FIG. 11*b* illustrates distribution of the particles at the exit plane of an optical concentrator, FIG. 11*c* illustrates a histogram plot of number particles across horizontal plane, and FIG. 11*d* illustrates a histogram plot of number particles across vertical plane.

Figure 12A:
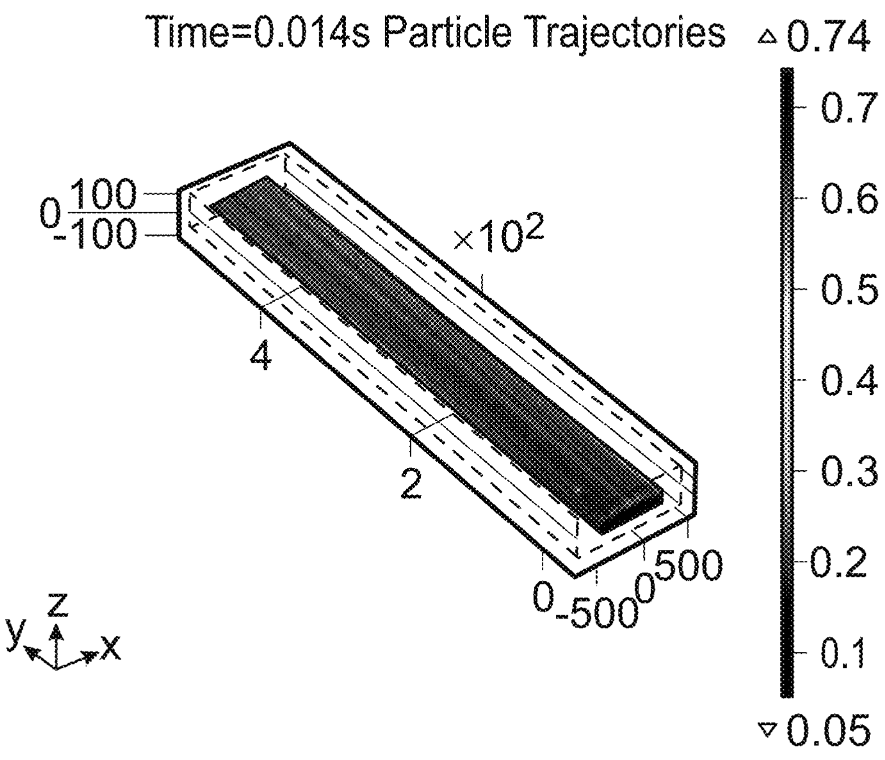
FIG. 12*a* illustrates a particle trajectory of 2.5 μm particles
Figure 12B:
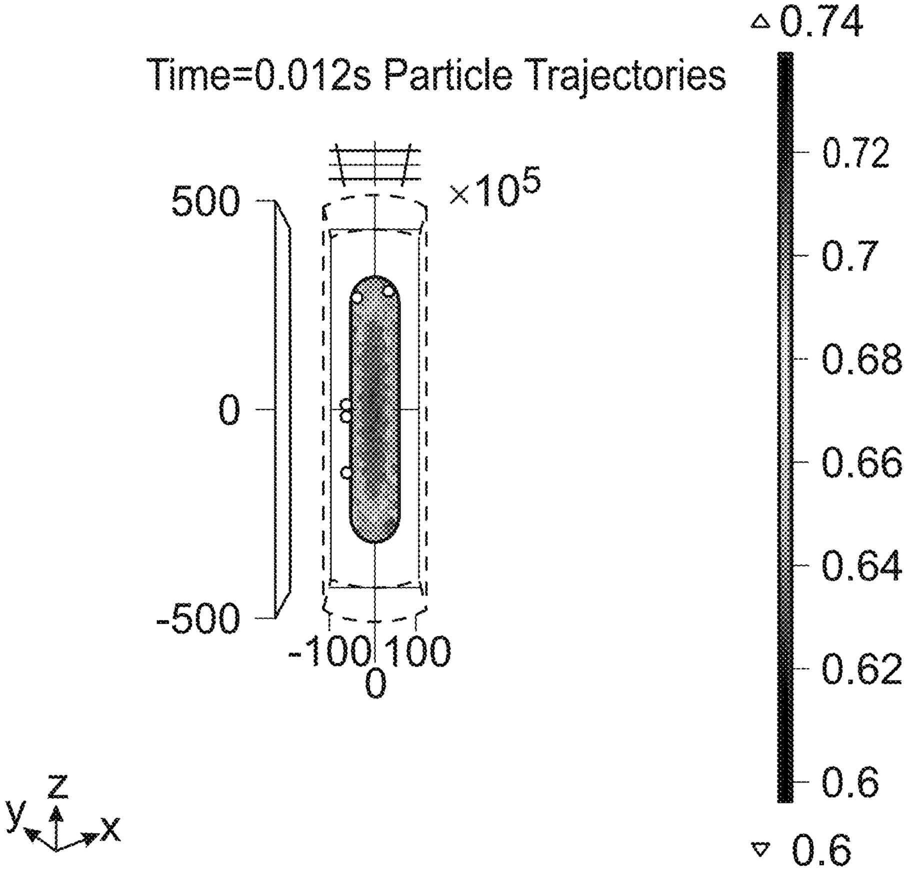
FIG. 12*b* illustrates distribution of the particles at the exit plane of optical concentrator.
Figure 12C:
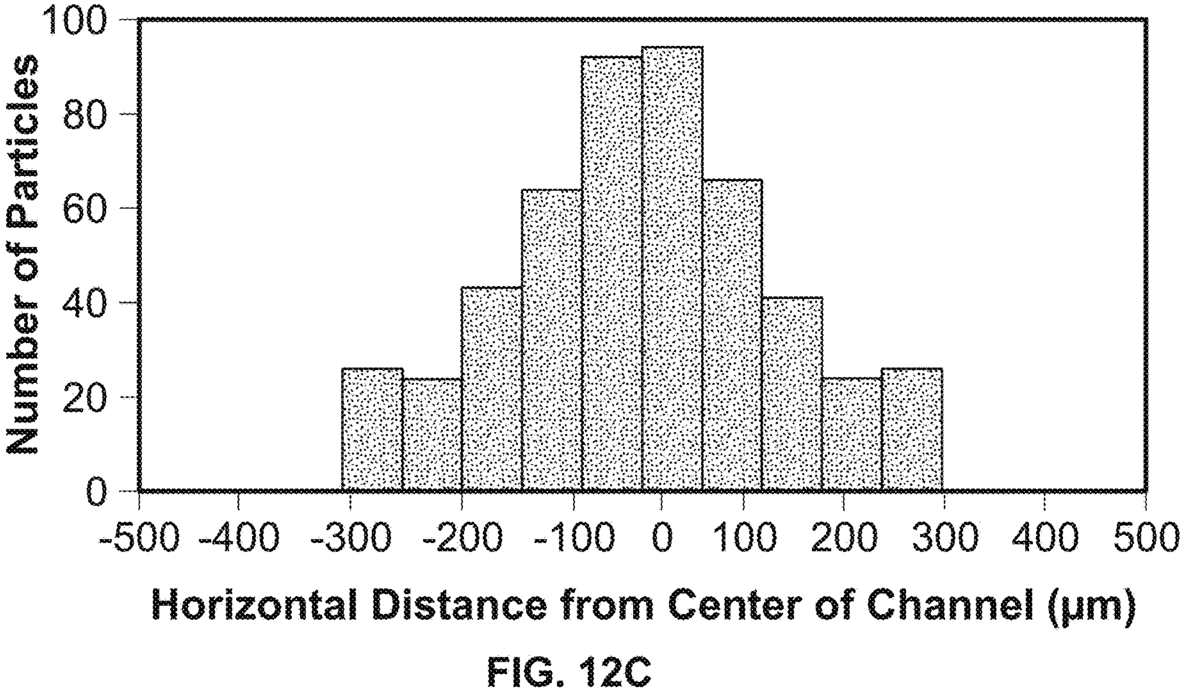
FIG. 12*c* illustrates a histogram plot of number particles across horizontal plane.
Figure 12D:
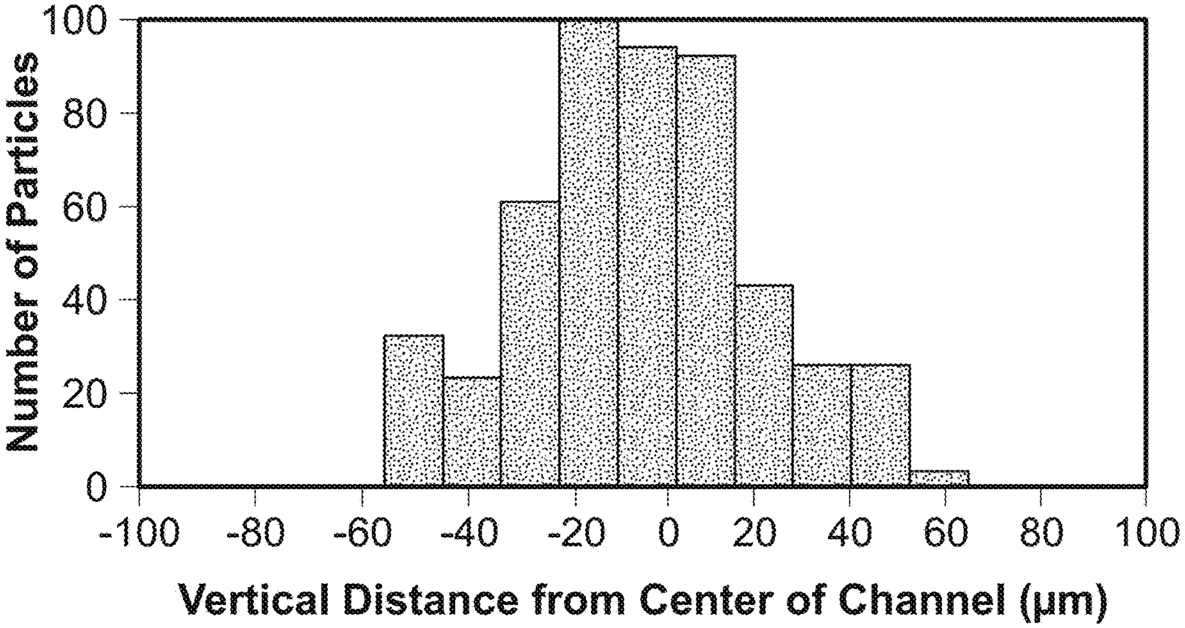
FIG. 12*d* illustrates a histogram plot of number particles across vertical plane.

FIG. 12*a* illustrates a particle trajectory of 2.5 μm particles, FIG. 12*b* illustrates distribution of the particles at the exit plane of optical concentrator, FIG. 12*c* illustrates a histogram plot of number particles across horizontal plane, and FIG. 12*d* illustrates a histogram plot of number particles across vertical plane.

Figure 13A:
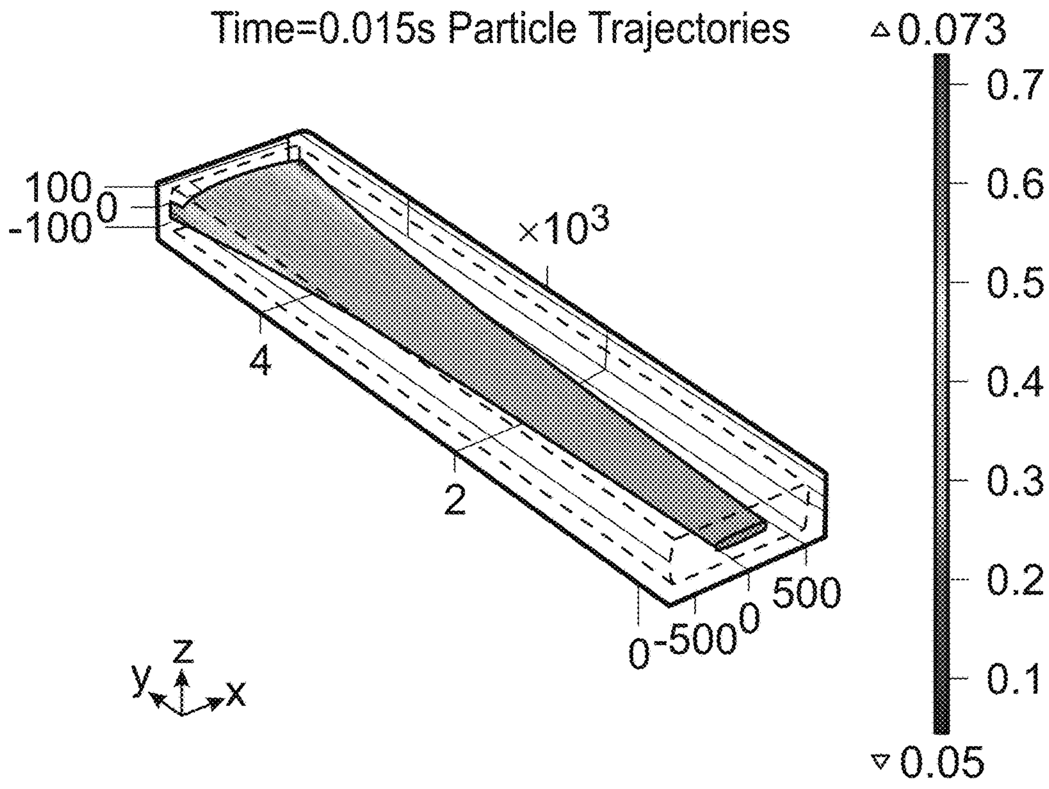
FIG. 13*a* illustrates a particle trajectory of 1 μm particles.
Figure 13B:
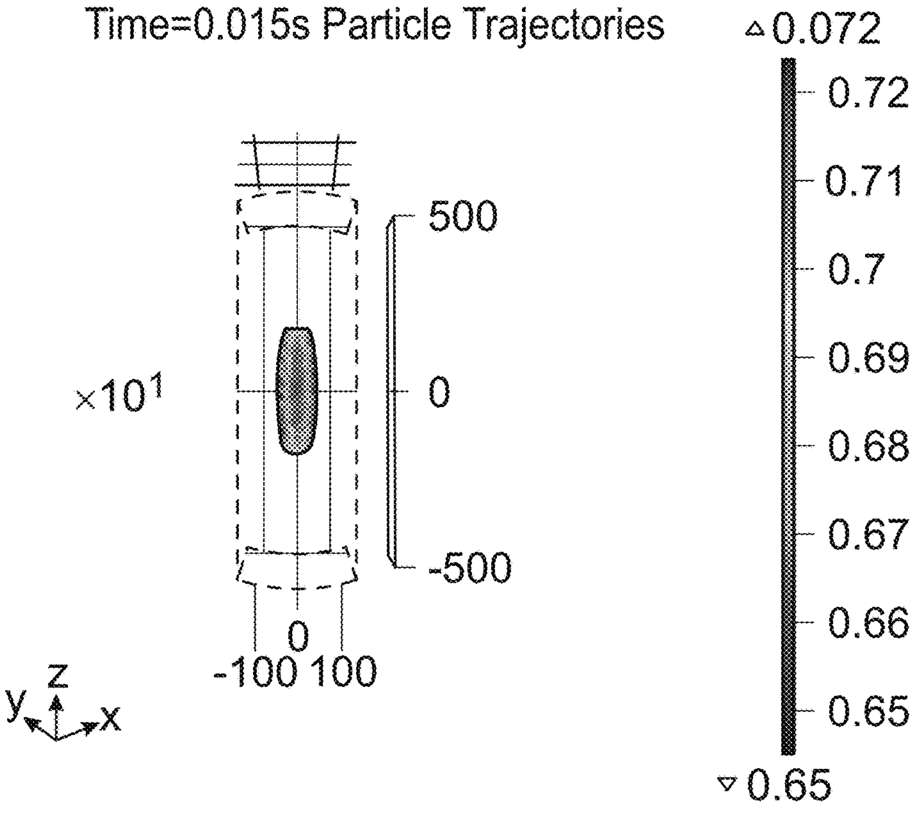
FIG. 13*b* illustrates distribution of the particles at the exit plane of optical concentrator.
Figure 13C:
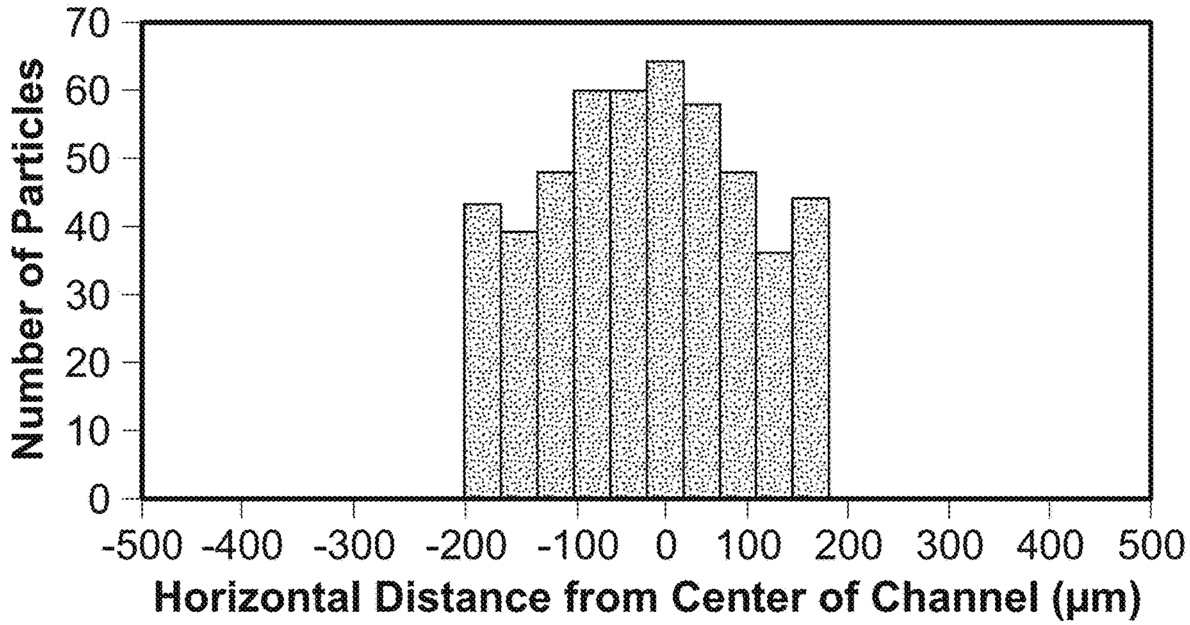
FIG. 13*c* illustrates a histogram plot of the number particles across horizontal plane.
Figure 13D:
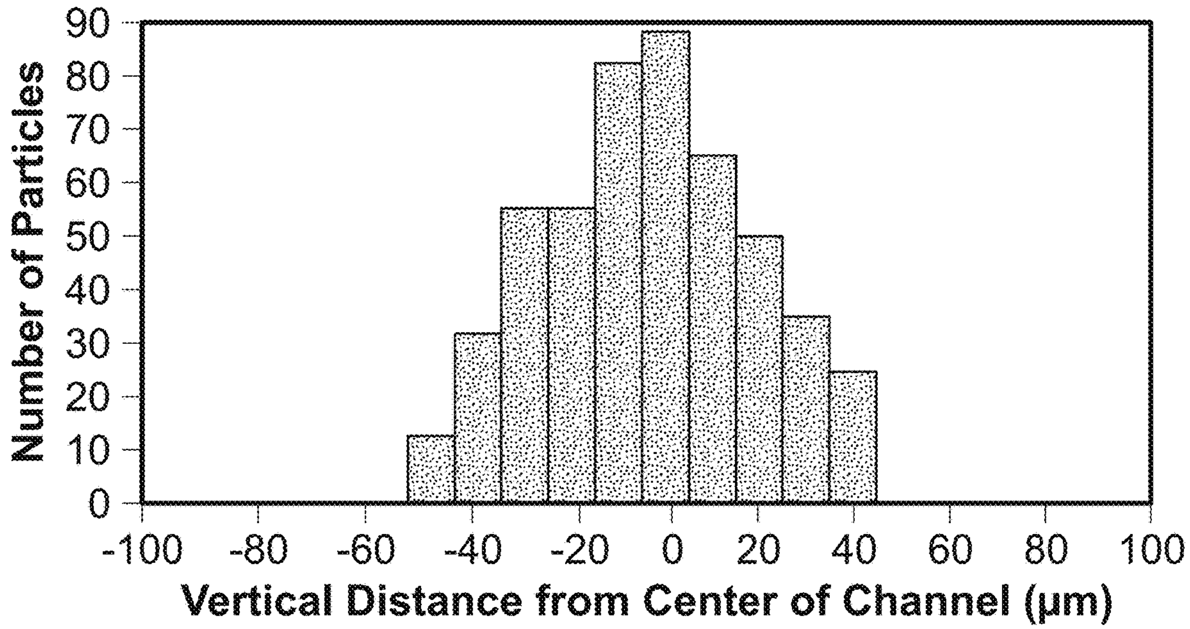
FIG. 13*d* illustrates a histogram plot of the number particles across vertical plane.

FIG. 13*a* illustrates a particle trajectory of 1 μm particles, FIG. 13*b* illustrates distribution of the particles at the exit plane of optical concentrator, FIG. 13*c* illustrates a histogram plot of the number particles across horizontal plane, and FIG. 13*d* illustrates a histogram plot of the number particles across vertical plane.

Figure 14A:
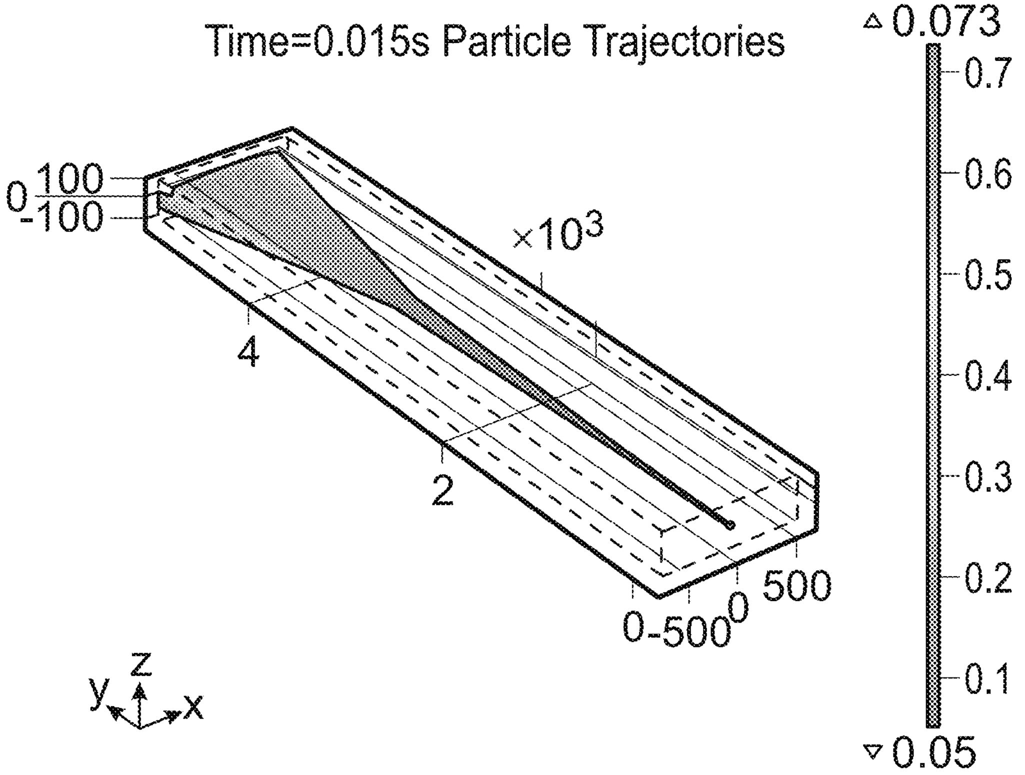
FIG. 14*a* illustrates a particle trajectory of 100 nm particles.
Figure 14B:
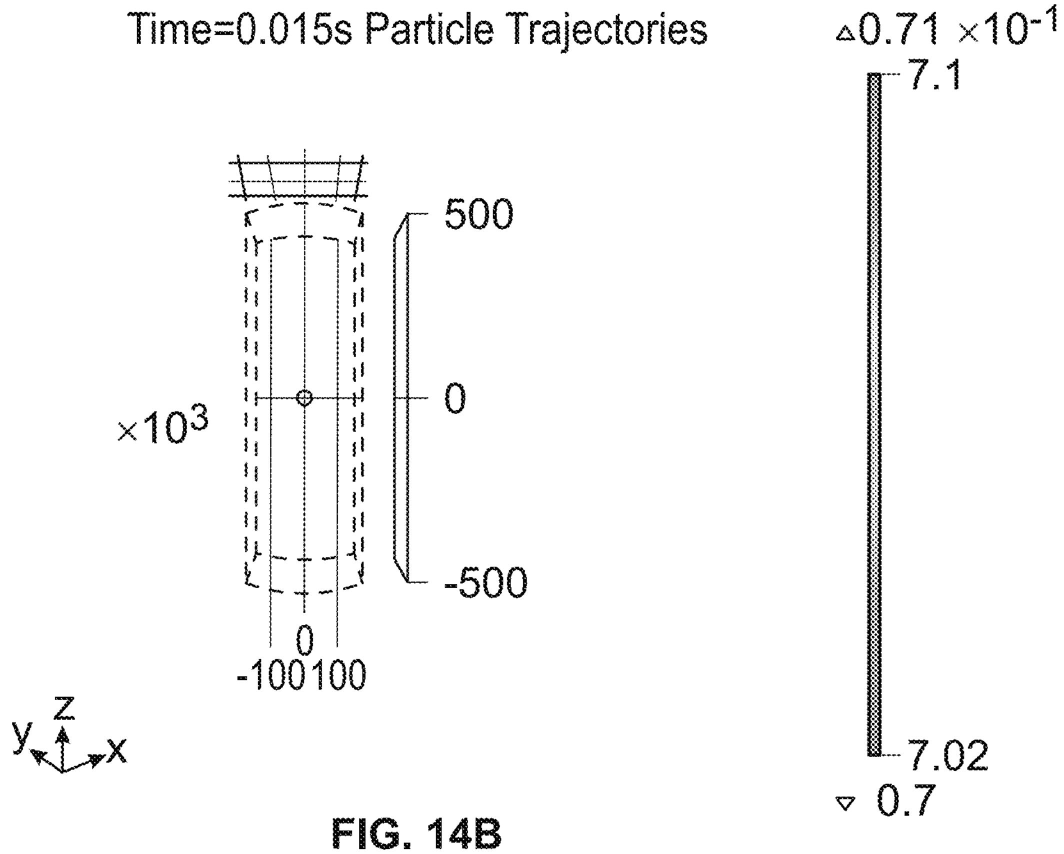
FIG. 14*b* illustrates distribution of the particles at the exit plane of optical concentrator.
Figure 14C:
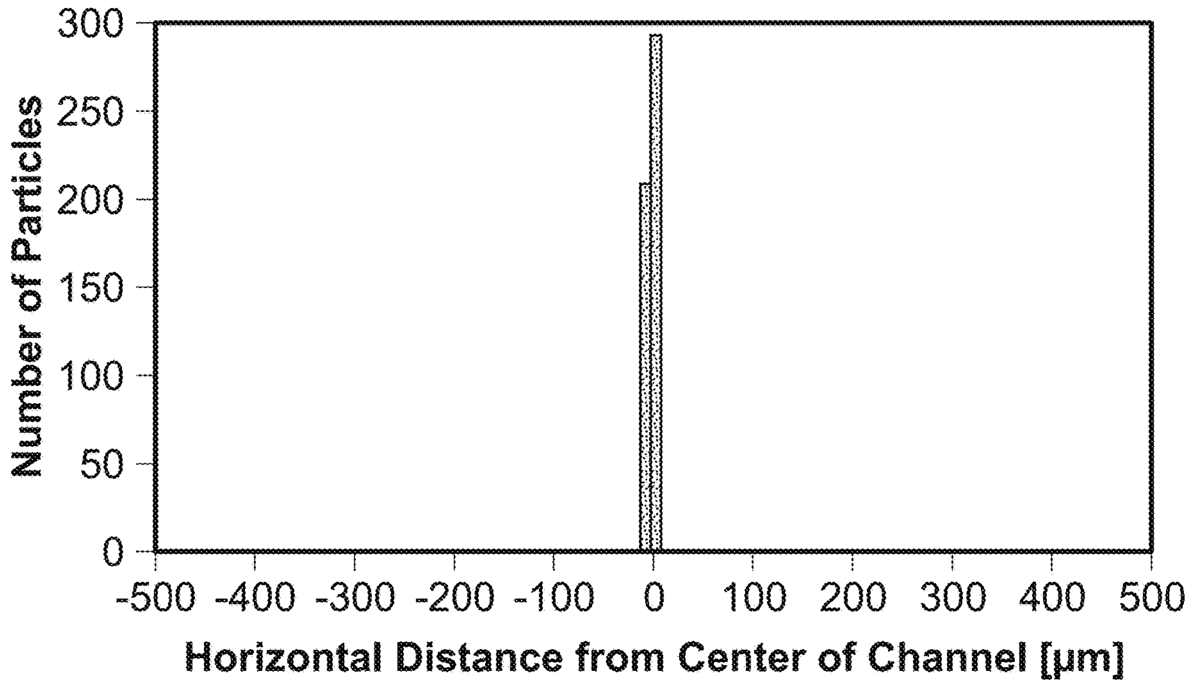
FIG. 14*c* illustrates a histogram plot of number particles across horizontal plane.
Figure 14D:
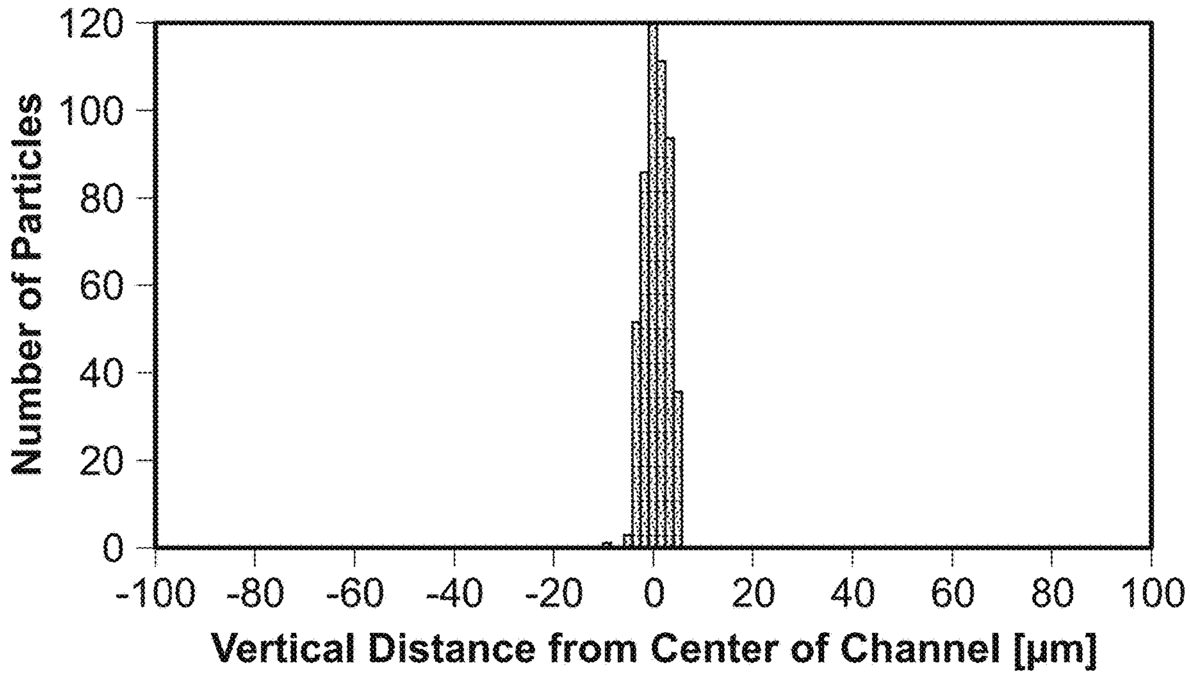
FIG. 14*d* illustrates a histogram plot of number particles across vertical plane.

FIG. 14*a* illustrates a particle trajectory of 100 nm particles, FIG. 14*b* illustrates distribution of the particles at the exit plane of optical concentrator, FIG. 14*c* illustrates a histogram plot of number particles across horizontal plane, and FIG. 14*d* illustrates a histogram plot of number particles across vertical plane.

FIGS. 11-14 illustrate that the optical concentrator can concentrate both small and bigger particles even though it has a better performance for smaller particles.

Figure 15:
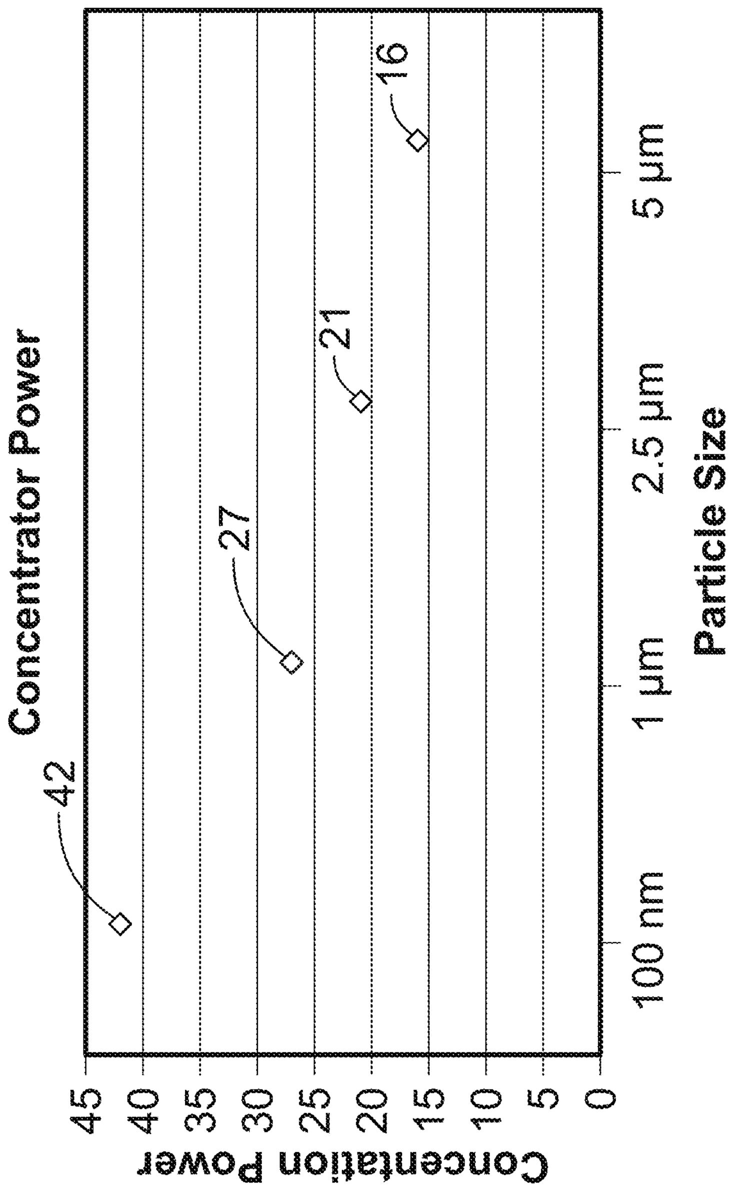
FIG. 15 illustrates the concentration power of the optical concentrator for particles of 100 nm, 1 μm, 2.5 μm and 5 μm.

To show the efficacy of the optical concentrator, the metric that is used is defined as the ratio of the density of particles in a rectangle of (200 μm×100 μm) at center of channel to density of evenly distributed particles over the cross section of the channel. FIG. 15 illustrates the concentration power of the optical concentrator for different particle sizes, specifically, 100 nm, 1 μm, 2.5 μm and 5 μm. The results show that concentration for all particle sizes can be achieved with moderate optical power. In some embodiments, the PM concentrator is used in conjunction with a mass-sensing element. The mass-sensing element may be used to determine mass concentration of the PM as deposited on the sensing device due to the oscillation frequency decreasing in proportion to the mass of particles that reach and adhere to the sensing element. Before particles are collected onto it, the mass-sensitive element can oscillate within a substantially high frequency range (i.e., around 1.6 GHz). As particles are deposited onto the mass-sensitive element, the frequency oscillation frequency may decrease proportionally.

In other embodiments, the mass-sensing element is connected to solid-state conversion circuitry. The conversion circuitry may measure the changing frequency of the mass-sensitive element as particles are deposited onto it. For example, the mass concentration of the particles may be determined based on the rate at which the frequency of the mass-sensitive element is reduced. Therefore, based on this measurement, mass concentration of the sampled particles may be determined.

In other embodiments, the PM concentrator is situated within a MEMS PM air-microfluidic sensor. The PM concentrator can be situated at the entrance to the MEMS air sensor, or at various positions within a MEMS air sensor. In some embodiments, the MEMS air sensor contains a plurality of PM concentrators distributed throughout the device. For example, each PM concentrator can by optically tuned to exert a certain radial force on PM as it passed through the concentrator. Therefore, a PM concentrator can be configured to concentrate a specific PM within a specific diameter size. A subsequent PM concentrator can concentrate an even more specific PM particle of a particular size.

The PM concentrator, like other MEMS or microfluidic devices can include a multi-layer central body structure in which the various microfluidic or microchannel elements are disposed. The body structures of the microfluidic devices typically employ a solid or semi-solid substrate that is typically planar in structure, i.e., substantially flat or having at least one flat surface. Suitable substrates may be fabricated from any one of a variety of materials, or combinations of materials that are compatible with the fluid in use. Often, the planar substrates are manufactured using solid substrates common in the fields of microfabrication, e.g., silica-based substrates, such as glass, quartz, silicon or polysilicon, as well as other known substrates, i.e., gallium arsenide. In the case of these substrates, common microfabrication techniques, such as photolithographic techniques, wet chemical etching, micromachining, i.e., drilling, milling and the like, may be readily applied in the fabrication of microfluidic devices and substrates. Alternatively, polymeric substrate materials may be used to fabricate the devices, including, e.g., polydimethylsiloxanes (PDMS), polymethylmethacrylate (PMMA), polyurethane, polyvinylchloride (PVC), polystyrene polysulfone, polycarbonate, polymethylpentene, polypropylene, polyethylene, polyvinylidine fluoride, ABS (acrylonitrile-butadiene-styrene copolymer), thermoplastic elastomers and the like. In the case of such polymeric materials, injection molding or embossing methods may be used to form the substrates having the microchannel and reservoir geometries as described. In such cases, original molds may be fabricated using any of the above described materials and methods. Any reservoirs, wells and microchannels can be fabricated into or on the microfluidic device using methods known to the skilled artisan.

According to the invention, a "microchannel channel" is a conduit associated with a device that is able to transport one or more fluids from one location to another, for example, from an inlet to an outlet of the device. One, two, or more fluids may flow through the channels, continuously, randomly, intermittently, etc. The channel may be a closed channel, or a channel that is open, for example, open to the external environment surrounding the device. The fluid(s) within the channel may partially or completely fill the channel. In some cases the fluid(s) may be held or confined within the channel or a portion of the channel in some fashion, for example, using surface tension (i.e., such that the fluid is held within the channel within a meniscus, such as a concave or convex meniscus). The channel may have any suitable cross-sectional shape that allows for fluid transport, for example, a square channel, a circular channel, a rounded channel, a rectangular channel (e.g., having any suitable aspect ratio), a triangular channel, an irregular channel, etc. The channel may be of any size within the device. For example, the channel may have a largest dimension perpendicular to a direction of fluid flow within the channel of less than about 1000 micrometers in some cases (i.e., a "microfluidic" channel), less than about 500 micrometers in other cases, less than about 400 micrometers in still other cases, less than about 300 micrometers in still other cases, less than about 200 micrometers in still other cases, less than about 100 micrometers in still other cases, or less than about 50 or 25 micrometers in still other cases. In some embodiments, the dimensions of the channel may be chosen such that fluid is able to freely flow through the channel. The dimensions of the channel may also be chosen in certain cases, for example, to allow a certain volumetric or linear flow rate of fluid within the channel. Of course, the number of channels, the shape or geometry of the channels, and/or the placement of channels within the device can be determined by those of ordinary skill in the art. In some embodiments, the PM concentrator may have several microchannels that lead to a primary microchannel wherein an optical cavity is disposed. In other embodiments, any number of microchannels associated with the PM concentrator may comprise at least one optical cavity. Moreover, the presence of multiple microchannels may allow PM from separate sources to be drawn into the PM concentrator. Other embodiments may have another microchannel downstream of the PM concentrator such that the microchannel is positioned to receive PM of a given size diameter to either eliminate the PM or to concentrate the PM further.

Such microchannels or microfluidic channel can contain any number of fluids. For instance, the channel may contain two fluids, three fluids, four fluids, etc. According to the invention, the term "fluid" generally refers to a substance that tends to flow and to conform to the outline of its container. Typically, fluids are materials that are unable to withstand a static shear stress, and when a shear stress is applied, the fluid experiences a continuing and permanent distortion. The fluid may have any suitable viscosity that permits at least some flow of the fluid. Examples of fluids include liquids and gases. Thus, the two or more fluids may be, for example, two or more flowing liquids, two or more flowing gases, one or more flowing liquids and one or more flowing gases, etc. In some embodiments, the fluid is at least one gas. In another embodiment, the fluid is any medium containing PM. In still further embodiments, the fluid is ambient air. In still other embodiments the fluid is any air sample containing PM.

The term "about" can refer to a variation of ±5%, ±10%, ±20%, or ±25% of the value specified. For example, "about 50" percent can in some embodiments carry a variation from 45 to 55 percent. For integer ranges, the term "about" can include one or two integers greater than and/or less than a recited integer at each end of the range. Unless indicated otherwise, the term "about" is intended to include values, e.g., weight percentages, proximate to the recited range that are equivalent in terms of the functionality of the individual ingredient, the composition, or the embodiment. The term about can also modify the end-points of a recited range as discuss above in this paragraph.

As will be understood by the skilled artisan, all numbers, including those expressing quantities of ingredients, properties such as molecular weight, reaction conditions, and so forth, are approximations and are understood as being optionally modified in all instances by the term "about." These values can vary depending upon the desired properties sought to be obtained by those skilled in the art utilizing the teachings of the descriptions according to the invention. It is also understood that such values inherently contain variability necessarily resulting from the standard deviations found in their respective testing measurements.

Documents as cited herein are incorporated by reference.

While the disclosure is susceptible to various modifications and alternative forms, specific exemplary embodiments of the present invention have been shown by way of example in the drawings and have been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

The invention claimed is:

1. A micro-electro mechanical system (MEMS) particulate matter concentrator comprising:

at least one microchannel; and at least one optical cavity disposed within the microchannel wherein the particulate matter is directed toward the center of the microchannel using an in-plane or out-of-plane optical intensity field;

a first continuous mirror and a second continuous mirror positioned substantially parallel to one another and disposed within the at least one optical cavity along an entire length of the microchannel to generate a converging optical intensity field; and an optical light source providing photons for the converging optical intensity field inside the optical cavity.

2. The MEMS particulate matter concentrator of claim 1, wherein the optical light source is a laser or laser diode.

3. The MEMS particulate matter concentrator of claim 1, wherein the first mirror and second mirror are concave cylindrical mirrors.

4. The MEMS particulate matter concentrator of claim 1, wherein the at least one optical light cavity comprises at least one of a refractive or diffractive elements to generate the converging optical intensity field.

5. The MEMS particulate matter concentrator of claim 4, wherein the refractive or diffractive elements comprise at least one of a mirror or lens.

6. The MEMS particulate matter concentrator of claim 5, wherein the mirror is selected from the group consisting of a planar mirror, convex mirror and concave mirror; and the lens is selected from the group consisting of biconvex, plano-convex, positive meniscus, negative meniscus, plano-concave, biconcave, planar, cylindrical, Fresnel, lenticular and gradient index lens.

7. The MEMS particulate matter concentrator of claim 1, wherein the mirrors are actuated mirrors, wherein the actuated mirrors are manipulated to focus the optical cavity.

8. The MEMS particulate matter concentrator of claim 7, wherein actuation is electrostatic actuation, piezoelectric actuation, or thermal actuation.

9. The MEMS particulate matter concentrator of claim 1, further comprising a mass-sensing film acoustic resonator to receive the concentrated particulate matter.

10. The MEMS particulate matter concentrator of claim 1, wherein the particulate matter comprises a diameter range of about 100 nanometers to about 5 micrometers.

11. The MEMS particulate matter concentrator of claim 2, wherein the laser or laser diode emits light with a power range of about 5 milliwatts to about 10 milliwatts.

12. The MEMS particulate matter concentrator of claim 2, wherein the laser or laser diode exerts an optical force of about 0.15 pico-Newtons to about 15 pico-Newtons on the particulate matter.

13. A method of concentrating particulate matter comprising:

drawing air samples into a microchannel from an external environment, wherein the air samples comprises particulate matter of varying size;

applying photons from an optical light source to create at least one confocal optical cavity within the microchannel wherein the confocal optical cavity comprises a converging optical intensity field; and passing the particulate matter through the at least one confocal optical cavity where the converging optical intensity field concentrates the particulate matter to a center of the microchannel, wherein the at least one confocal optical cavity comprises a first continuous mirror and a second continuous mirror positioned substantially parallel to one another and disposed along an entire length of the microchannel to generate the converging optical intensity field.

14. The method of concentrating particulate matter of claim 13, wherein the optical light source is a laser or laser diode.

15. The method of concentrating particulate matter of claim 14, wherein the optical cavity comprises at least one of a refractive or diffractive element to create the converging optical intensity field within the confocal optical cavity.

16. The method of concentrating particulate matter of claim 13, wherein the particulate matter having a diameter size of X is concentrated to the center of the microchannel more than particulate matter having a diameter size of 2X.

* * * * *